(12) United States Patent
Tamura

(10) Patent No.: US 8,502,284 B2
(45) Date of Patent: Aug. 6, 2013

(54) SEMICONDUCTOR DEVICE AND METHOD OF MANUFACTURING SEMICONDUCTOR DEVICE

(75) Inventor: Naoyoshi Tamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 131 days.

(21) Appl. No.: 12/495,235

(22) Filed: Jun. 30, 2009

(65) Prior Publication Data
US 2009/0267119 A1 Oct. 29, 2009

Related U.S. Application Data

(63) Continuation of application No. PCT/JP2007/053309, filed on Feb. 22, 2007.

(51) Int. Cl.
*H01L 29/76* (2006.01)

(52) U.S. Cl.
USPC ........... 257/288; 438/407; 438/520; 438/528; 438/548; 438/918; 438/143; 438/514; 438/543; 438/904; 438/933; 257/607; 257/609; 257/616; 257/18; 257/19

(58) Field of Classification Search
USPC ...... 257/288, 607, 609–616, 18–19, E29.193; 438/407, 520, 528, 548, 918, 143, 514, 543, 438/904, 917, 752, 933
See application file for complete search history.

(56) References Cited

U.S. PATENT DOCUMENTS

| 5,557,122 | A  | * | 9/1996  | Shrivastava et al.  | 257/309 |
| 6,403,975 | B1 | * | 6/2002  | Brunner et al.      | 257/15  |
| 6,406,973 | B1 | * | 6/2002  | Lee                 | 438/416 |
| 6,621,131 | B2 |   | 9/2003  | Murthy et al.       |         |
| 6,730,551 | B2 | * | 5/2004  | Lee et al.          | 438/191 |
| 7,037,770 | B2 | * | 5/2006  | Chidambarrao et al. | 438/154 |
| 7,102,205 | B2 | * | 9/2006  | Chidambarrao et al. | 257/592 |
| 7,307,273 | B2 | * | 12/2007 | Currie              | 257/18  |

(Continued)

FOREIGN PATENT DOCUMENTS
JP  2004-193166 A  7/2004
JP  2006-253317 A  9/2006

(Continued)

OTHER PUBLICATIONS

Chinese Office Action dated Mar. 9, 2011, issued in corresponding Chinese Patent Application No. 2007-80051085.4.

(Continued)

*Primary Examiner* — Fernando L Toledo
*Assistant Examiner* — Mohammed Shamsuzzaman
(74) *Attorney, Agent, or Firm* — Westerman, Hattori, Daniels & Adrian, LLP

(57) ABSTRACT

The semiconductor device includes a silicon substrate having a channel region, a gate electrode formed over the channel region, buried semiconductor regions formed in a surface of the silicon substrate on both sides of the gate electrode, for applying to the surface of the silicon substrate a first stress in a first direction parallel to the surface of the silicon substrate, and stressor films formed on the silicon substrate between the channel region and the buried semiconductor regions in contact with the silicon substrate, for applying to the silicon substrate a second stress in a second direction which is opposite to the first direction.

18 Claims, 22 Drawing Sheets

U.S. PATENT DOCUMENTS

| | | | |
|---|---|---|---|
| 7,335,545 B2* | 2/2008 | Currie | 438/197 |
| 7,687,354 B2* | 3/2010 | Grudowski et al. | 438/282 |
| 7,736,957 B2* | 6/2010 | Grudowski et al. | 438/153 |
| 7,808,081 B2* | 10/2010 | Bryant et al. | 257/616 |
| 7,816,766 B2* | 10/2010 | Tamura et al. | 257/616 |
| 7,875,521 B2* | 1/2011 | Shimamune et al. | 438/300 |
| 7,906,798 B2* | 3/2011 | Ohta et al. | 257/190 |
| 2004/0256614 A1* | 12/2004 | Ouyang et al. | 257/20 |
| 2005/0247926 A1* | 11/2005 | Sun et al. | 257/19 |
| 2006/0014366 A1* | 1/2006 | Currie | 438/517 |
| 2006/0081875 A1* | 4/2006 | Lin et al. | 257/190 |
| 2006/0202278 A1 | 9/2006 | Shima et al. | |
| 2006/0202280 A1 | 9/2006 | Shima et al. | |
| 2006/0255365 A1* | 11/2006 | Ko et al. | 257/192 |
| 2006/0289856 A1* | 12/2006 | Shimamune et al. | 257/19 |
| 2007/0001162 A1* | 1/2007 | Orlowski et al. | 257/19 |
| 2007/0012913 A1* | 1/2007 | Ohta et al. | 257/19 |
| 2007/0126036 A1* | 6/2007 | Ohta et al. | 257/288 |
| 2007/0210301 A1* | 9/2007 | Han | 257/18 |
| 2007/0262385 A1* | 11/2007 | Nguyen et al. | 257/351 |
| 2008/0006818 A1* | 1/2008 | Luo et al. | 257/19 |
| 2008/0054250 A1* | 3/2008 | Chuang et al. | 257/19 |
| 2008/0054357 A1* | 3/2008 | Chidambarrao et al. | 257/347 |
| 2008/0087923 A1* | 4/2008 | Tamura | 257/288 |
| 2008/0142838 A1* | 6/2008 | Ohta et al. | 257/190 |
| 2008/0179627 A1* | 7/2008 | Ieong et al. | 257/190 |
| 2009/0014807 A1* | 1/2009 | Tang et al. | 257/369 |
| 2009/0045466 A1* | 2/2009 | Nakamura | 257/369 |
| 2009/0090941 A1* | 4/2009 | Tamura | 257/288 |
| 2009/0134381 A1* | 5/2009 | Shimamune et al. | 257/19 |
| 2009/0179254 A1* | 7/2009 | Van Schaijk et al. | 257/324 |
| 2010/0123173 A1* | 5/2010 | Tanaka | 257/288 |
| 2011/0049533 A1* | 3/2011 | Shimamune et al. | 257/77 |
| 2011/0136307 A1* | 6/2011 | Ohta et al. | 438/231 |
| 2012/0135574 A1* | 5/2012 | Tamura | 438/285 |

FOREIGN PATENT DOCUMENTS

| | | |
|---|---|---|
| JP | 2006-253318 A | 9/2006 |
| JP | 2006-261283 A | 9/2006 |
| JP | 2007-36205 A | 2/2007 |
| WO | 2005/027192 A2 | 3/2005 |

OTHER PUBLICATIONS

Imternational Search Report of PCT/JP2007/053309, Mailing Date of May 15, 2007.

Thompson, S.E. et al.: "A 90-nm Logic Technology Featuring Strained-Silicon"; IEEE Transactions on Electron Devices, Nov. 2004, pp. 1790-1797, vol. 51, No. 11.

* cited by examiner

SEMICONDUCTOR DEVICE AND METHOD OF MANUFACTURING SEMICONDUCTOR DEVICE

CROSS-REFERENCE TO RELATED APPLICATIONS

This application is a Continuation of International Application No. PCT/JP2007/053309, with an international filing date of Feb. 22, 2007, which designating the United States of America, the entire contents of which are incorporated herein by reference.

FIELD

The embodiments discussed herein are related to a semiconductor device and method of manufacturing semiconductor device, more specifically, a semiconductor device having a MIS transistor and a method of manufacturing the semiconductor device.

BACKGROUND

As one technique of improving the operation speed of a semiconductor device, the technique of applying a stress to a channel region of a MIS transistor is known. When a silicon crystal is subjected to stress and strained, the symmetry of the band structure of the silicon crystal, which has been isotropic, collapses, and the energy levels are separated. The carrier scattering decrease and effective mass decrease by the lattice vibrations due to the energy band structure change resultantly can improve the mobility of the carriers.

In the n-channel MIS transistor, the electron mobility can be improved by applying tensile stress channel-wise. In the p-channel MIS transistor, oppositely compressive stress is applied channel-wise, the hole mobility can be improved. The p-channel MIS transistor, in which holes are carriers, has low carrier mobility in comparison with the carrier mobility of the n-channel MIS transistor, in which electrons are carriers, which much affects the operation speed when the CMOS circuit is formed. Especially improvement of the carrier mobility of the p-channel MIS transistor is expected.

FIG. 22 is a diagrammatic sectional view illustrating the structure of the p-channel MIS transistor described in, e.g., S. E. Thompson et al., "A 90-nm logic technology featuring strained-silicon", *IEEE Transaction on Electron Devices*, vol. 51, pp. 1790-1797, 2004.

A gate electrode 204 is formed over a silicon substrate 200 with a gate insulating film 202 formed therebetween. The surface of the silicon substrate 200, which is immediately below the gate electrode 204 is a channel region of the transistor. In the silicon substrate 200 on both sides of the gate electrode 204, impurity diffused regions 206 are respectively formed. On the surface of the silicon substrate 200 in the regions where the impurity diffused regions 206 are formed, SiGe films 208 are buried. On the gate electrode 204 and the SiGe films 208, silicide films 210 are respectively formed.

The SiGe films 208, whose lattice constant is larger than the lattice constant of silicon, is buried in the impurity diffused regions 206, whereby a compressive stress is introduced into the SiGe film 208 in parallel to the surface of the silicon substrate 200. This further induces into the SiGe film 208 a strain which extends the lattice perpendicularly to the surface of the silicon substrate 200.

Then, in the channel region of the silicon substrate 200, which is sandwiched by the SiGe films 208, a stress which extends the lattice perpendicularly to the surface of the silicon substrate 200, drawn by the extension of the SiGe films 208. Consequently, a compressive stress can be induced in the channel region in parallel to the surface of the silicon substrate 20.

The following is another example of related art of the present invention: U.S. Pat. No. 6,621,131.

However, in the above-described semiconductor device, the strain magnitude to be applied to the channel region cannot be sufficiently large, and for further speed-up, the lattice strain to be applied to the channel region is required to be increased.

SUMMARY

According to one aspect of an embodiment, there is provided a semiconductor device including a silicon substrate having a channel region, a gate electrode formed over the channel region of the semiconductor substrate, buried semiconductor regions formed in a surface of the silicon substrate on both sides of the gate electrode, for applying to the surface of the silicon substrate a first stress in a first direction parallel to the surface of the silicon substrate, and stressor films formed on and in contact with the silicon substrate between the channel region and the buried semiconductor regions, for applying to the silicon substrate a second stress in a second direction which is opposite to the first direction.

According to another aspect of an embodiment, there is provided a method of manufacturing a semiconductor device including forming a gate electrode over a silicon substrate, forming a first sidewall insulating film on a side wall of the gate electrode, forming a first semiconductor layer for applying a first stress in a first direction parallel to a surface of the silicon substrate on the silicon substrate in a region where the silicon substrate is not covered by the gate electrode and the first sidewall insulating film, forming a second sidewall insulating film on the side wall of the gate electrode with the first sidewall insulating film formed on, etching the first semiconductor layer and the silicon substrate with the gate electrode, the first sidewall insulating film and the second sidewall insulating film as the mask to thereby remove the first semiconductor layer in a region where the second sidewall insulating film is not formed and form a trench in the silicon substrate, and burying in the trench a second semiconductor layer for applying to the silicon substrate a second stress in a second direction opposite to the first direction.

According to further another aspect of an embodiment, there is provided a method of manufacturing a semiconductor device including forming a gate electrode over a silicon substrate, forming on a side wall of the gate electrode a sidewall insulating film of silicon nitride which applies to the silicon substrate a first stress in a first direction parallel to a surface of the silicon substrate, etching the silicon substrate with the gate electrode and the sidewall insulating film as the mask to form a trench in the silicon substrate in a region where the silicon substrate is not covered by the gate electrode and the sidewall insulating film, and burying in the trench a semiconductor layer which applies to the silicon substrate a second stress in a second direction opposite to the first direction.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

The semiconductor device and method of manufacturing the same according to a first embodiment will be explained with reference to FIGS. 1 to 13B.

Figure 1:
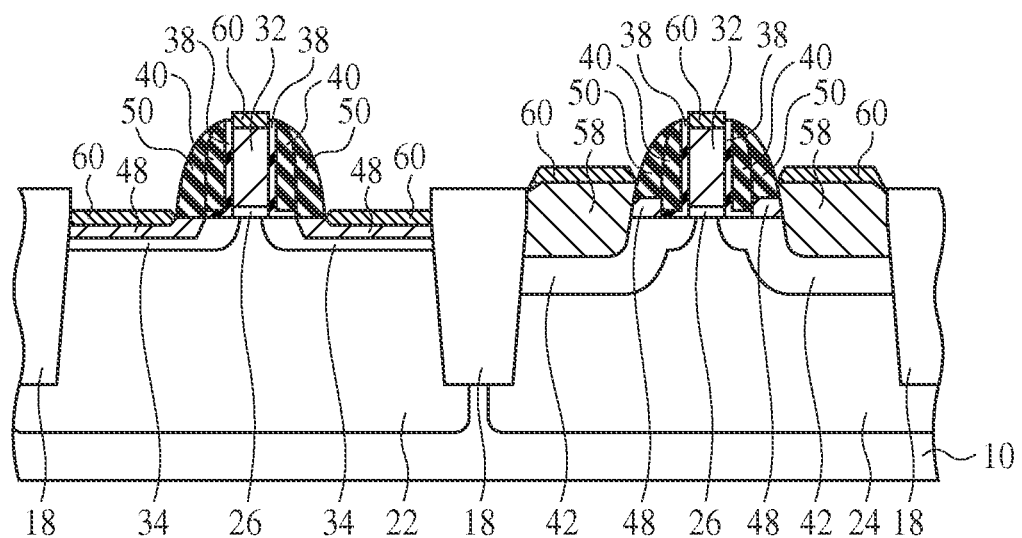
FIG. 1 is a diagrammatic sectional view illustrating the structure of the semiconductor device according to a first embodiment.
Figure 2A:
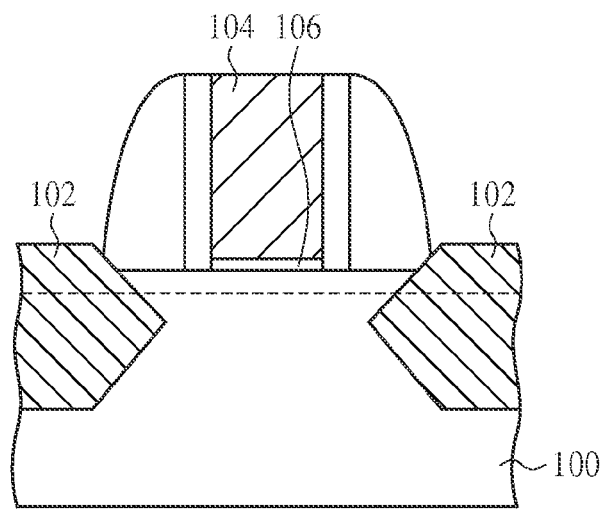
FIGS. 2A-2C are diagrammatic sectional views illustrating the structures of the transistor with a stressor buried in the source/drain regions.
Figure 2B:
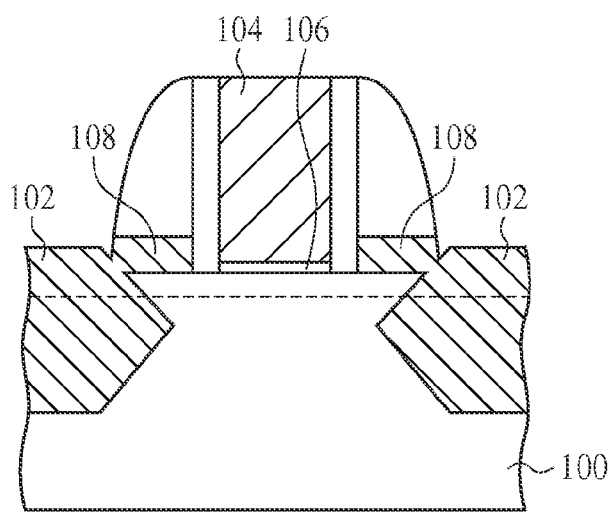
Figure 2C:
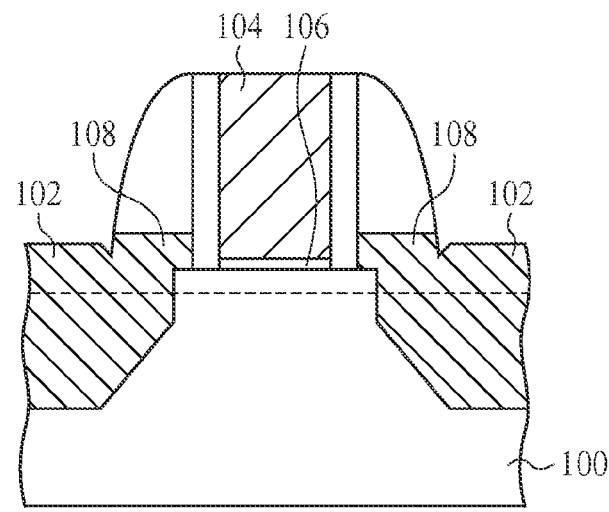
Figure 3:
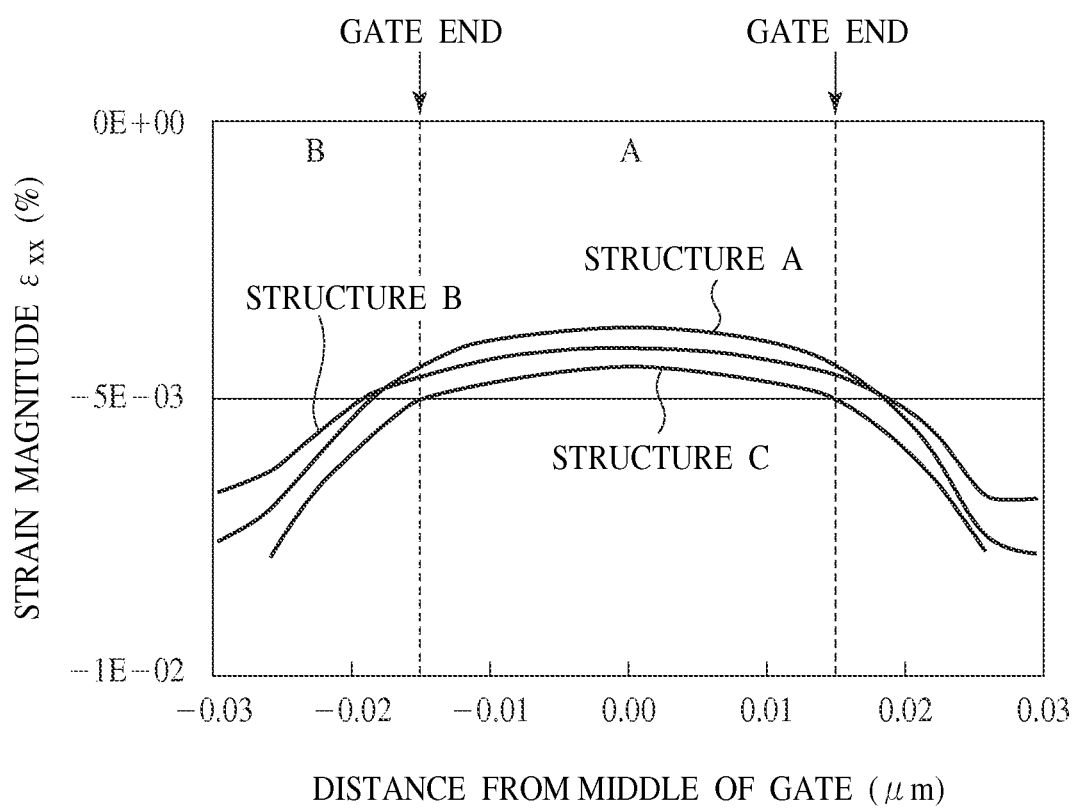
FIGS. 3 and 5 are graphs illustrating strain magnitudes of the channel regions in the direction parallel to the surfaces of the silicon substrates estimated by finite element simulator.
Figure 4A:
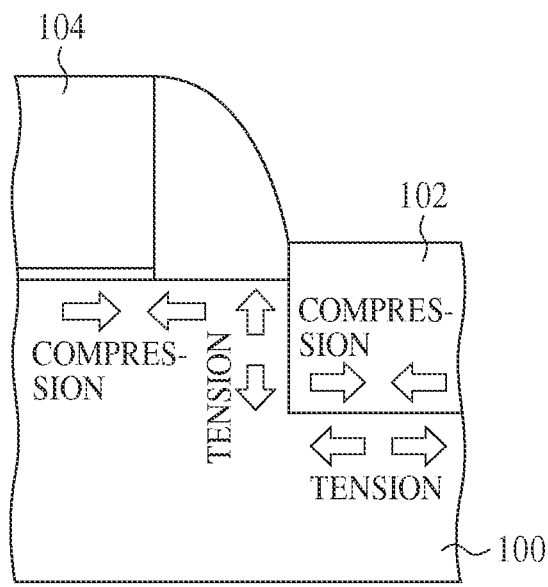
FIGS. 4A and 4B are views illustrating states of the stresses applied to the silicon substrate by the stressor of the SiGe film.
Figure 4B:
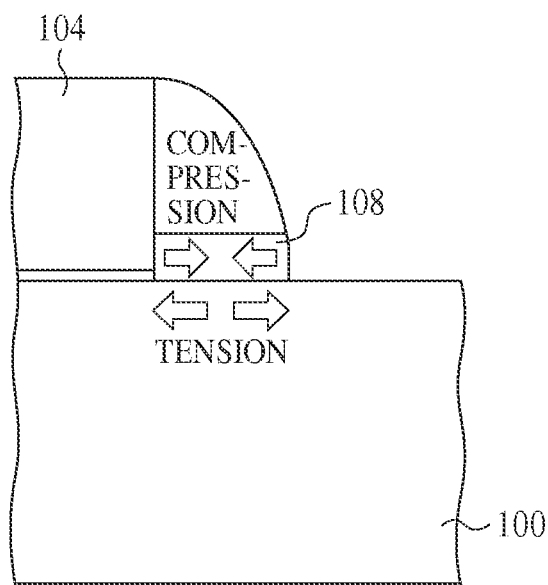
Figure 5:
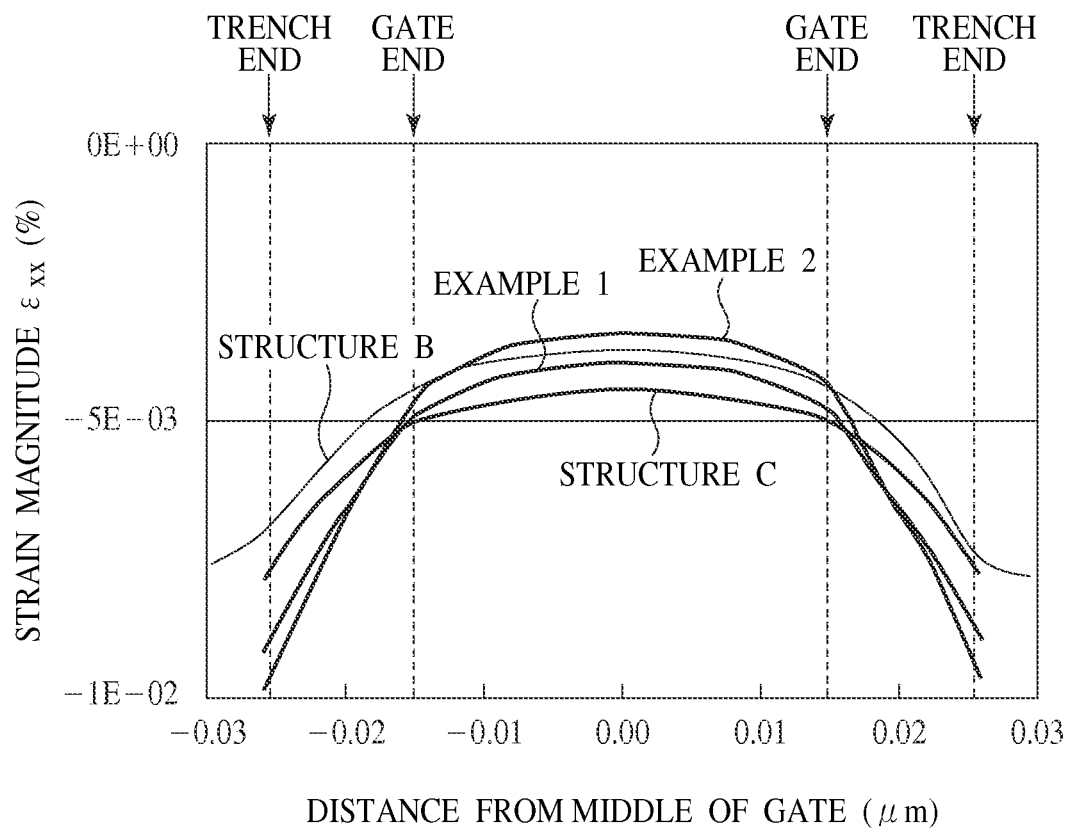
Figure 6A:
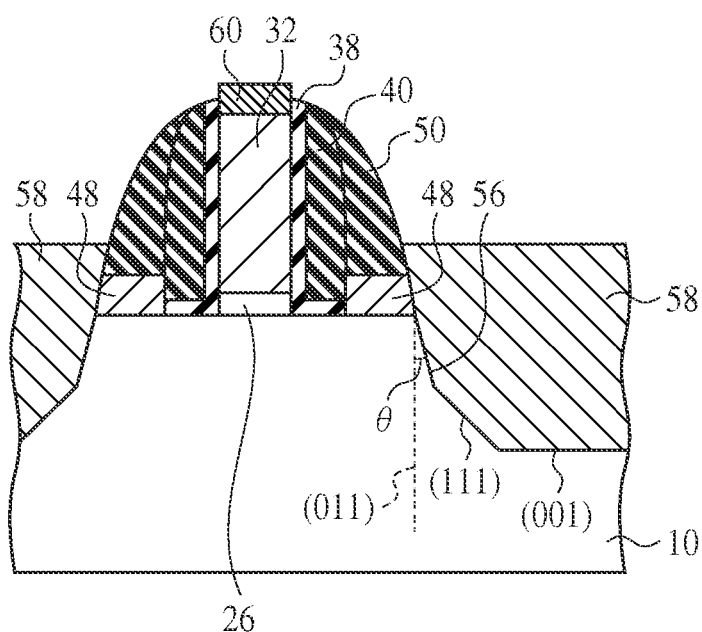
FIGS. 6A and 6B are views illustrating the configurations of ends of the buried semiconductor region on the side of channel region, of the semiconductor device according to the first embodiment.
Figure 6B:
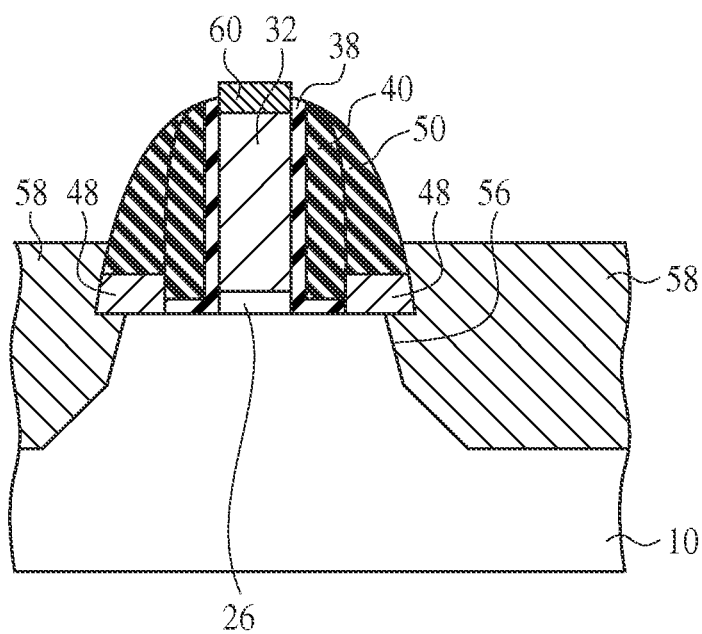

FIG. 1 is a diagrammatic sectional view illustrating the structure of the semiconductor device according to the present embodiment. FIGS. 2A-2C are diagrammatic sectional views illustrating the structures of the transistor with a stressor buried in the source/drain regions. FIGS. 3 and 5 are graphs illustrating strain magnitudes of the channel regions in the direction parallel to the surfaces of the silicon substrates estimated by finite element simulator. FIGS. 4A and 4B are views illustrating states of the stresses applied to the silicon substrate by the stressor of the SiGe film. FIGS. 6A and 6B are views illustrating the configurations of ends of the buried semiconductor region on the side of channel region, of the semiconductor device according to the present embodiment. FIGS. 7A-13B are sectional views illustrating a method of manufacturing the semiconductor device according to the first embodiment.

First, the structure of the semiconductor device according to the present embodiment will be explained with reference to FIG. 1.

In a silicon substrate 10, a device isolation film 18 for defining device regions is formed. In FIG. 1, the device region on the left side of the middle device isolation film 18 is an n-channel transistor forming region, and the device region on the right side of the middle device isolation film 18 is a p-channel transistor forming region.

In the silicon substrate 10 in the n-channel transistor forming region, a p-well 22 is formed. In the silicon substrate 10 in the p-channel transistor forming region, an n-well 24 is formed.

Over the silicon substrate 10 in the n-channel transistor forming region, a gate electrode 32 is formed with a gate insulating film 26 formed therebetween. The surface of the silicon substrate 10 immediately below the gate electrode 32 is to be the channel region of the n-channel transistor. In the silicon substrate 10 on both sides of the gate electrode 32, impurity diffused regions 34 are formed. On the side wall of the gate electrode 32, sidewall insulating films 38, 40, 50 are formed. On the surface of the silicon substrate 10 in regions where the sidewall insulating films 38, 40 are not formed, a $Si_{1-y}C_y$ ($y \leqq 0.03$: C fraction) films 48 are buried (in this specification, the $Si_{1-y}C_y$ film 48 is also called "buried semiconductor region"). On the gate electrode 32 and the $Si_{1-y}C_y$ films 48 in regions where the sidewall insulating film 50 is not formed, nickel silicide films 60 are respectively formed. Thus, in the n-channel transistor forming region, an n-channel transistor including the $Si_{1-y}C_y$ films 48 buried in the source/drain regions is formed.

Over the silicon substrate 10 in the p-channel transistor forming region, a gate electrode 32 is formed with a gate insulating film 26 formed therebetween. The surface of the silicon substrate 10 immediately below the gate electrode 32 is to be the channel region of the p-channel transistor. In the silicon substrate 10 on both sides of the gate electrode 32, impurity diffused regions 42 are formed. On the side wall of the gate electrode 32, Sidewall insulating films 38, 40, 50 are formed. On the surface of the silicon substrate 10 in regions where the sidewall insulating films 38, 40, 50 are not formed, SiGe films 58 are buried (in this specification, the SiGe film 58 is also called "buried semiconductor region"). Between the sidewall insulating film 50 and the silicon substrate 10, the $Si_{1-y}C_y$ film 48 is formed (in this specification, the $Si_{1-y}C_y$ film 48 is also called a "stressor film"). On the gate electrode 32 and the SiGe films 58, nickel silicide films 60 are respectively formed. Thus, in the p-channel transistor forming region, a p-channel transistor including the SiGe films 58 buried in the source/drain regions and the $Si_{1-y}C_y$ film 48 formed over the silicon substrate 10 between the channel region and the SiGe film 58 is formed.

As described above, the semiconductor device according to the present embodiment includes in the p-channel transistor the SiGe film 58 buried in the source/drain regions, and the $Si_{1-y}C_y$ film 48 formed over the silicon substrate 10 between the channel region and the SiGe film 58.

The reason for constituting the source/drain regions of the p-channel transistor in such structure will be detailed below.

As described above, as the structure for applying compressive strain to the channel region of the p-channel transistor is known the structure (buried type) that SiGe, whose lattice constant is larger than silicon, is buried in the source/drain regions.

FIGS. 2A, 2B and 2C are diagrammatic sectional views of various structures of the buried type transistor. In each view, 100 indicates a silicon substrate; 102, a SiGe film; 104, a gate electrode; 106, a gate insulating film; and 108, extended portion formed of SiGe film.

FIG. 2A illustrates the structure that the SiGe film 102 is buried only in the source/drain regions. FIG. 2B and FIG. 2C illustrate the structure that in addition to the SiGe films 102 buried in the source/drain regions, the extended portions 108 of SiGe film are formed over the silicon substrate 100 between the channel region and the SiGe films 102. In the structures of FIGS. 2A and 2B, the parts which are in contact with the side surfaces of the SiGe films 108 on the side of the channel region are formed of Si(111) facets. In the structure of FIG. 2C, the parts which are in contact with the side surfaces of the SiGe film 102 on the side of the channel region are formed of facets vertical to the surface of the silicon substrate 100. The structures illustrated in FIGS. 2B and 2C are described in Japanese Patent Application No. 2006-162134 filed by the applicant of the present application.

FIG. 3 is a graph of strain magnitudes, estimated by finite element simulator, of the channel regions of the semiconductor devices of the respective structures illustrated in FIG. 2, which are in the direction parallel to the surfaces of the silicon substrates 100. On the horizontal axis, the distances from the middle of the gate electrodes 104 are taken, the strain magnitudes (compressive strains) are taken on the vertical axis. The larger negative values indicate larger strain magnitudes. The dotted lines in FIGS. 2A, 2B and 2C indicate the positions where the strain magnitudes were measured. In FIG. 3, the structures of FIGS. 2A, 2B and 2C are called respectively by "Structure A", "Structure B" and "Structure C".

As illustrated in FIG. 3, in all the structures, the strain magnitudes are larger at the ends of the channel regions than at the middle of the channel regions. This is because the SiGe films 102, which are the stressors, are remoter toward the middle of the channel regions.

In the structure of FIG. 2A (Structure A) without the extended portions 108 of SiGe film, the strain magnitudes at the ends of the channel region can be large, but the strain magnitude at the middle of the channel region is small. In the structure of FIG. 2B (Structure B) with the extended portions 108 of SiGe film additionally formed, the effect of improving the strain magnitude at the middle of the channel region is found, but the strain magnitude at the ends of the channel region is decreased. In the structure of FIG. 2C (Structure C) having the sides which are in contact with the side surfaces of the channel region of the SiGe film 102 formed of facets vertical to the substrate surface, the decrease of the strain magnitude at the ends of the channel region is suppressed while the strain magnitude at the middle of the channel region can be increased.

To improve the operation speed of the transistor, it is important to increase the injection rate of carriers at the end of the channel region (source end), and to this end, it is preferable to increase the strain magnitude at the end of the source. The structure of FIG. 2C described above, which can suppress the decrease of the strain magnitude at the ends of the channel region while can increase the strain magnitude at the middle of the channel region, provide preferable characteristics, but for further characteristics improvement, it is required to increase the strain magnitude at the ends of the channel region.

Then, as for the structure of FIG. 2C, the stress the stressors apply to the silicon substrate 100 will be considered.

FIGS. 4A and 4B are diagrammatic views illustrating the states of stress to be applied to the silicon substrate 100 by the stressor. FIG. 4A is a diagrammatic view of the states of stress to be applied to the silicon substrate 100 by the SiGe film 102 buried in the source/drain region. FIG. 4B is a diagrammatic view of the states of stress to be applied to the silicon substrate 100 by the extended portion 108 of SiGe film.

The lattice constant of the SiGe film 102 buried in the source/drain region matches with that of silicon of the substrate in the direction parallel to the surface of the silicon substrate 100, so that, as illustrated in FIG. 4A, the lattices are substantially extended depth-wise. That is, also in the part of silicon in contact with this, the lattices are extended also depth-wise and resultantly are subjected to compressive stress in the direction parallel to the surface of the silicon substrate 100.

On the other hand, the lattice constant of the extended part 108 of SiGe film matches with that of silicon of the substrate in the direction parallel to the surface of the silicon substrate 100, so that, as illustrated in FIG. 4B, the extended part 108 acts to apply tensile stress to the lattice of silicon immediately below the extended part 108 in the direction parallel to the substrate surface.

As described above, as for the stress applied to the channel region in the direction parallel to the surface of the silicon substrate 100, the stress introduced by the SiGe film 102 and the stress introduced by the extended portion 108 are opposite to each other. Accordingly, in the structure of FIG. 2C, it is considered that the stress introduced by the SiGe film 102 and the stress introduced by the extended portion 108 mutually interfere, and the stress magnitude in the ends of the channel regions are decreased.

Then, in the present embodiment, in place of the extended portion of SiGe film, the extended portion ($Si_{1-y}C_y$ film 48) of a material whose lattice constant is smaller than silicon ($Si_{1-y}C_y$) is provided so that compressive stress can be applied in the direction parallel to the surface of the silicon substrate 10. The semiconductor device is thus constituted, whereby the stress introduced by the SiGe film buried in the source/drain region and the stress introduced by the extended portion of the $Si_{1-y}C_y$ film 48 are in the same direction parallel to the surface of the silicon substrate 10, and the strain magnitude at the end of the channel region can be improved.

FIG. 5 is a graph of the strain magnitudes of the channel region in the direction parallel to the surface of the silicon substrate, which were estimated by finite element simulator. On the horizontal axis, the distances from the middle of the gate electrode are taken, and the magnitudes of the strains are taken on the vertical axis. It is illustrated that as the negative values are larger, the strain magnitudes are larger. In the graph, "Example 1" and "Example 2" are of the semiconductor device according to the present embodiment including the extended portion of $Si_{1-y}C_y$ film, and "Structure B" and "Structure C" are of the semiconductor devices of FIGS. 2B and 2C. In Example 1, the carbon concentration of the $Si_{1-y}C_y$ film, namely y-value is 0.02, and in Example 2, the carbon concentration of the $Si_{1-y}C_y$ film, y-value is 0.03.

As shown in FIG. 5, it can be seen that Example 1 and Example 2, which include the extended portion of $Si_{1-y}C_y$ film, can dramatically increase the strain magnitude at the ends of the channel region in comparison with Structure B and Structure C, which include the extended portion formed of SiGe.

On the other hand, the extended portion is formed of $Si_{1-y}C_y$ film, whereby the strain magnitude at the middle of the channel region is decreased. The decrease of the strain magnitude at the middle of the channel region is increased as the carbon concentration is higher, i.e., the lattice constant difference from silicon is larger.

To improve the operation speed of the transistor, it is preferable to increase also the strain magnitude at the middle of the channel region. However, for the improvement of the operation speed of the transistor, it is very important to increase the injection rate of the carriers at the end of the channel region (source terminal). As the injection rate of the carriers at the source terminal is increased, the inertia can cause the carriers to propagate at high velocity in the channel region. The effect of improving the operation speed of the transistor increases especially in future devices whose gate lengths will be very short and in which the decrease of the carrier mobility at the middle of the channel will be very small.

As described above, as the carbon concentration of the $Si_{1-y}C_y$ film is increased, the strain magnitude at the ends of the channel region can be increased, but the strain magnitude at the middle of the channel region becomes small. Thus, it is preferable that the carbon concentration of the $Si_{1-y}C_y$ film in the extended portion is suitably set in accordance with required characteristics of the transistor.

For the p-channel transistor whose gate length is about 0.03 μm, the inventor of the present application has studied, based on the result of FIG. 5, preferably, the carbon concentration of the $Si_{1-y}C_y$ film in the extended portion will be not more than 3%, preferably less than 3%, more preferably not more than 2%. On the other hand, the carbon concentration of the $Si_{1-y}C_y$ film in the extended portion is preferably not less than 1%, because when the carbon concentration is less than 1%, the lattice constant difference from silicon is too small to function as the stressor.

FIGS. 5A and 5B are views of the configuration of the channel-side end of the buried semiconductor region of the semiconductor device according to the present embodiment.

It is preferable that a trench 56 for the buried semiconductor region (SiGe film 58) to be buried in has the relationship that the side wall of the trench 58 on the side of the channel region has the relationship of θ>0 when the inclination angle of the side wall of the trench 58 to the substrate normal toward the gate electrode 32 (see FIG. 6A).

When the side wall of the trench 56 on the side of the channel region is formed of (011) plane, which is parallel to the substrate normal (θ=0), because of the high crystal growth on (011) plane, crystal growths in different plane orientations collide, and facet lines are formed in the grown SiGe film 58. Then, the facet lines are changed into defect lines in the crystals. Thus, it is preferable that the side wall of the trench 56 on the side of the channel region has an angle θ larger than 0 degree so that the recess plane direction is offset from (011) plane.

The upper end of the trench 56 on the side of the channel region may be position below the extended portion ($Si_{1-y}C_y$ film 48) (see FIG. 6B). However, the extended portion does not function as the stressor unless the extended portion is in contact with the surface of the silicon substrate 10, and it is preferable that at lest a part of the extended part is in contact with the surface of the silicon substrate 10.

Next, the method of manufacturing the semiconductor device according to the present embodiment will be explained with reference to FIGS. 7A to 13B.

First, on the silicon substrate 10, a silicon oxide film 12 of, e.g., a 10 nm-thickness is formed by, e.g., dry oxidation at 900° C.

Figure 7A:
FIGS. 7A-7C, 8A-8C, 9A-9B, 10A-10B, 11A-11B, 12A-12B and 13A-13B are sectional views illustrating a method of manufacturing the semiconductor device according to the first embodiment.

Next, on the silicon oxide film 12, a silicon nitride film 14 of, e.g., an about 100 nm-thickness is formed by, e.g., CVD method (FIG. 7A). The silicon nitride film 14 is deposited by, for example, using $SiH_2Cl_2$ and $NH_3$ as the raw material gas and at 750° C. substrate temperature.

Figure 7B:
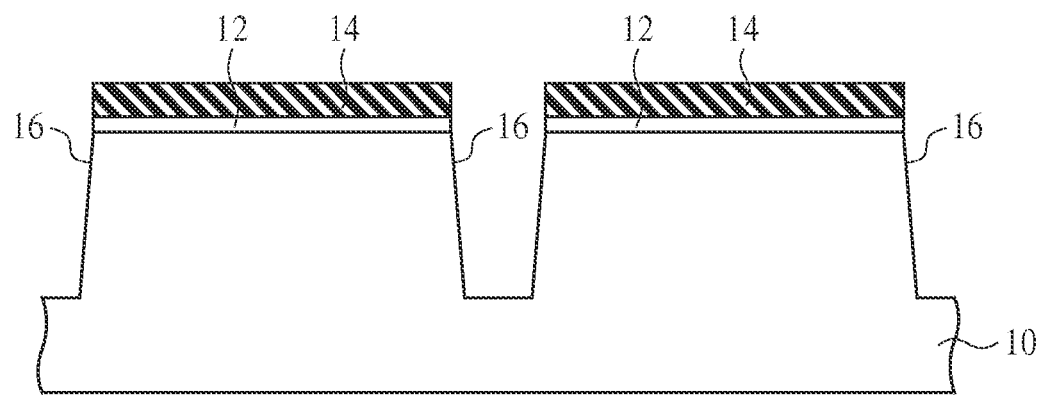

Next, by photolithography and dry etching, the silicon nitride film 14, the silicon oxide film 12 and the silicon substrate 10 are patterned to form device isolation trenches 16 in the device isolation regions of the silicon substrate 10 (FIG. 7B).

Then, the inside walls of the device isolation trenches 16 are oxidized, and then, a silicon oxide film is deposited over the entire surface by, e.g., plasma CVD method to fill the device isolation trenches 16 with the silicon oxide film.

Figure 7C:
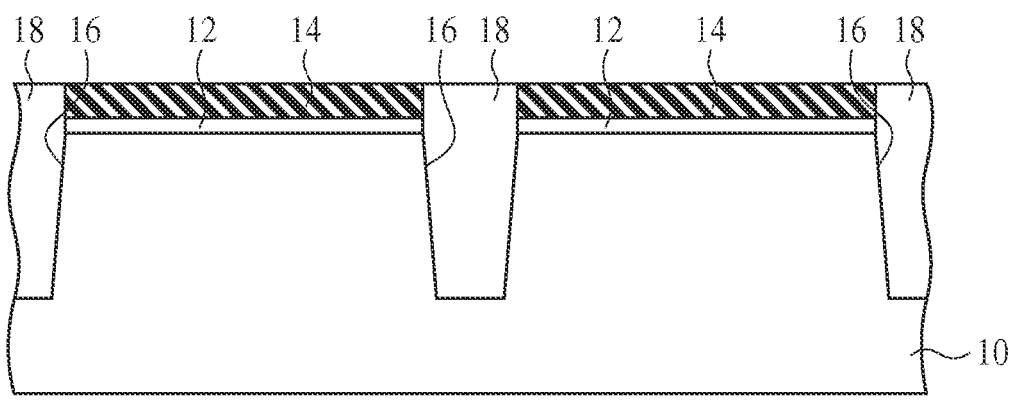

Then, by, e.g., CMP (Chemical Mechanical Polishing) method, the silicon oxide film is polished until the silicon oxide film 14 is exposed. Thus, the device isolation films 18 of silicon oxide film buried in the device isolation trenches 16 are formed (FIG. 7C).

Next, by wet etching using, e.g., phosphoric acid heated at 150° C., the silicon nitride film 14 on the device regions defined by the device isolation films 18 is removed.

Figure 8A:
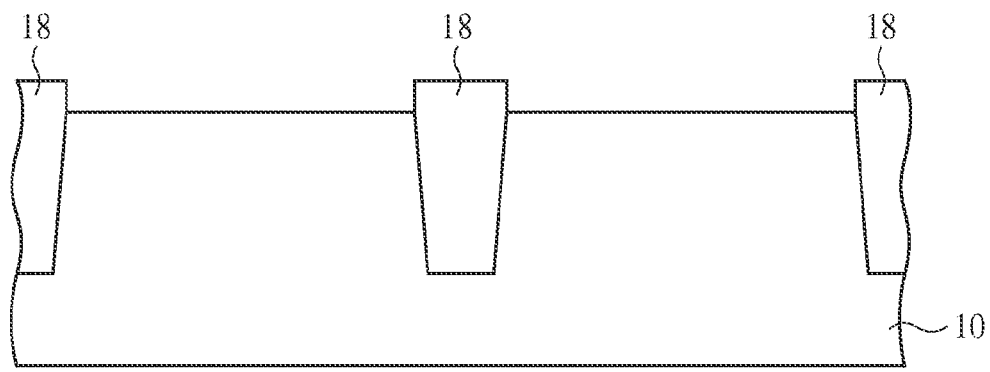

Next, by wet etching using, e.g., aqueous solution of hydrofluoric acid, the silicon oxide film 12 on the device region is removed (FIG. 8A).

Next, by, e.g., thermal oxidation, a silicon oxide film 20 is formed as a sacrificial oxidation film.

Then, by photolithography, a photoresist film (not illustrated) covering a p-channel transistor forming region and exposing an n-channel transistor forming region is formed. Then, p-type impurity ions are implanted, and a p-well 22 is formed in the silicon substrate 10 in the n-channel transistor forming region.

Figure 8B:
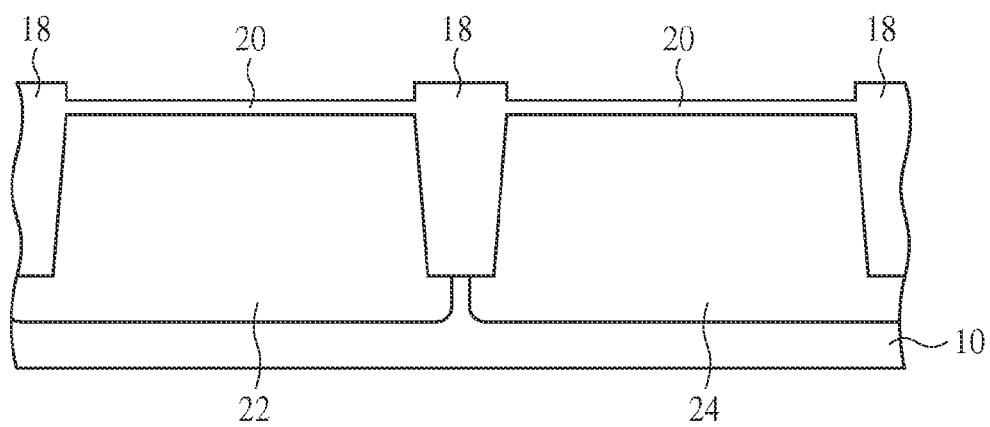

In the same way, a photoresist film (not illustrated) covering the n-channel transistor forming region and exposing the p-channel transistor forming region is formed, and then n-type impurity ions are ion implanted to form an n-well 24 in the silicon substrate 10 in the p-channel transistor forming region (FIG. 8B).

Then, by wet etching using, e.g., aqueous solution of hydrofluoric acid, the silicon oxide film 20 on the device regions is removed.

Next, on the device regions, a silicon oxide film of, e.g., a 1.5 nm-thickness is formed by, e.g., dry oxidation method to form a gate insulating film 26 of the silicon oxide film.

Next, over the entire surface, a polycrystalline silicon film 28 of, e.g., a 100 nm-thickness is deposited by, e.g., thermal-CVD method.

Next, by photolithography, a photoresist film (not illustrated) covering the p-channel transistor forming region and exposing the n-channel transistor forming region is formed, and then n-type impurity ions, e.g., phosphorus ions are implanted to a dose of, e.g., $8\times10^{15}$ $cm^{-2}$ selectively into the polycrystalline silicon film 28 in the n-channel transistor forming region.

In the same way, by photolithography, a photoresist film (not illustrated) covering the n-channel transistor forming region and exposing the p-channel transistor forming region is formed, and then p-type impurity ions, e.g., boron ions are implanted to a dose of, e.g., $6\times10^{15}$ $cm^{-2}$ selectively into the polycrystalline silicon film 28 in the p-channel transistor forming region.

Figure 8C:
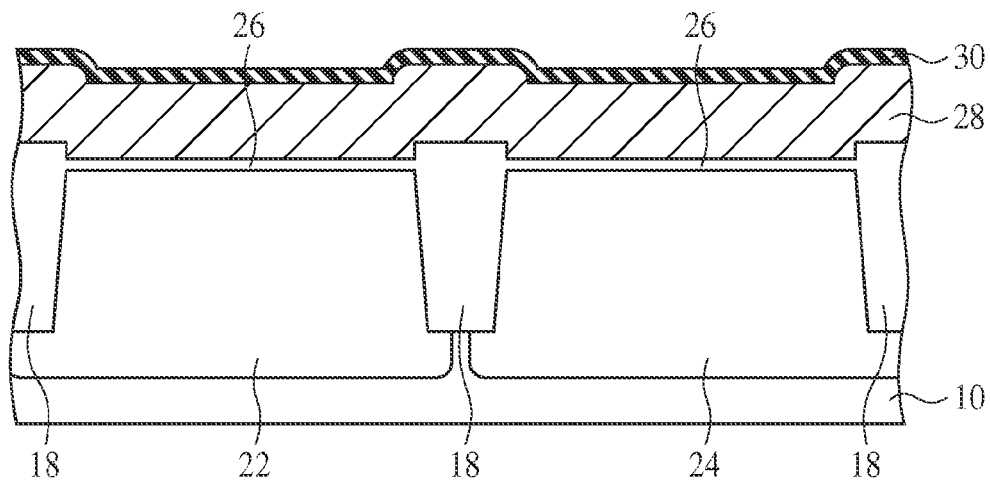

Then, on the polycrystalline silicon film 38, a silicon nitride film 30 of, e.g., a 30 nm-thickness is formed by, e.g., CVD method (FIG. 8C).

Figure 9A:
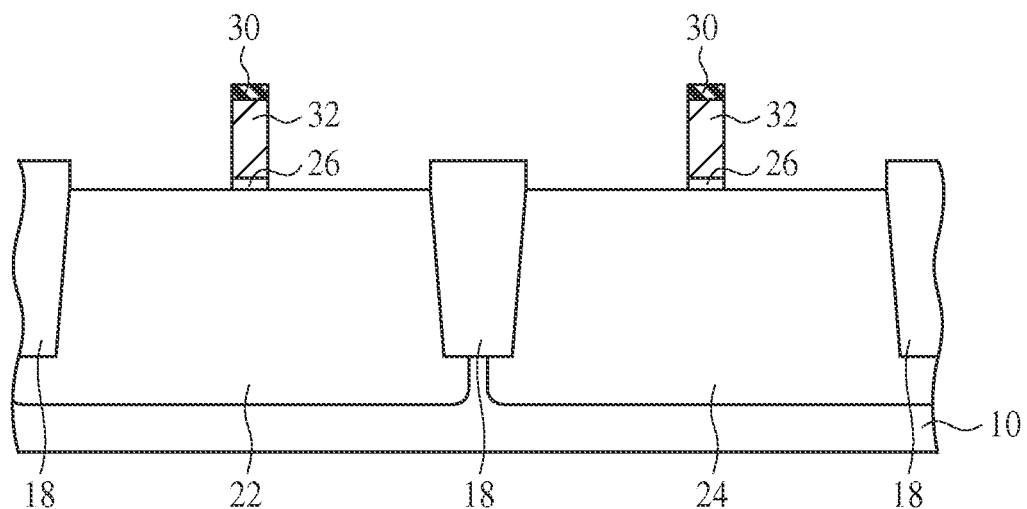

Next, by photolithography and dry etching, the silicon nitride film 30 and the polycrystalline silicon film 28 are patterned to form gate electrodes 32 of the polycrystalline silicon film 28 (FIG. 9A).

Then, a photoresist film (not illustrated) covering the p-channel transistor forming region and exposing the n-channel transistor forming region is formed, and then with the photoresist film and the gate electrode 32 as the mask n-type impurity ions are implanted to form impurity diffused regions 34 in the silicon substrate 10 on both sides of the gate electrode 32.

Figure 9B:
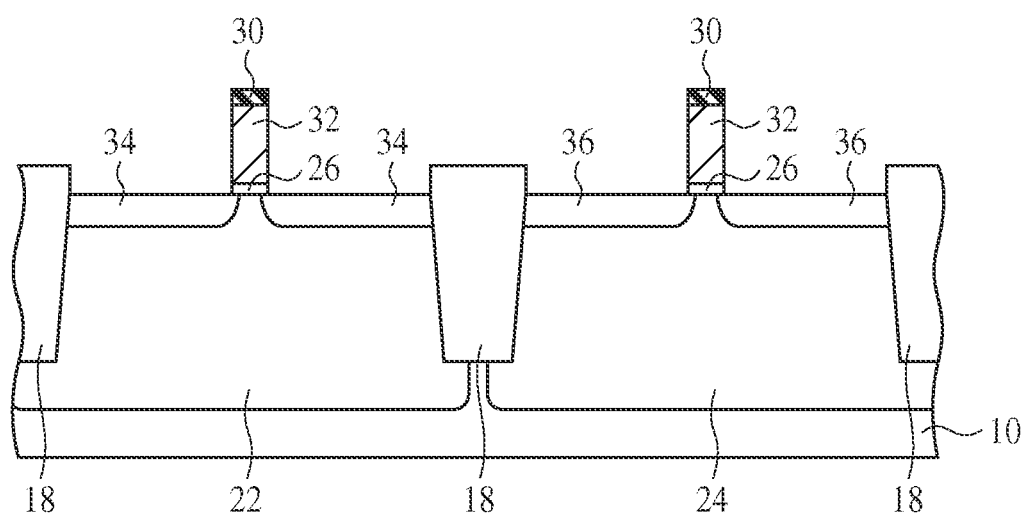

In the same way, by photolithography, a photoresist film (not illustrated) covering the n-channel transistor forming region and exposing the p-channel transistor forming region is formed, and then with the photoresist film ad the gate electrode 32 as the mask, a p-type impurity ions are implanted to form impurity diffused regions 36 in the silicon substrate 10 on both sides of the gate electrode 32 (FIG. 9B).

Next, over the entire surface, a silicon oxide film of, e.g., a 3 nm-thickness and a silicon nitride film of, e.g., a 10 nm-thickness are sequentially deposited by, e.g., CVD method. The substrate temperature is set at, e.g., 500-600° C.

Next, by dry etching, the silicon nitride film and the silicon oxide film are etched back to form a sidewall insulating film 38 of silicon oxide film and a sidewall insulating film 40 of silicon nitride film.

Figure 10A:
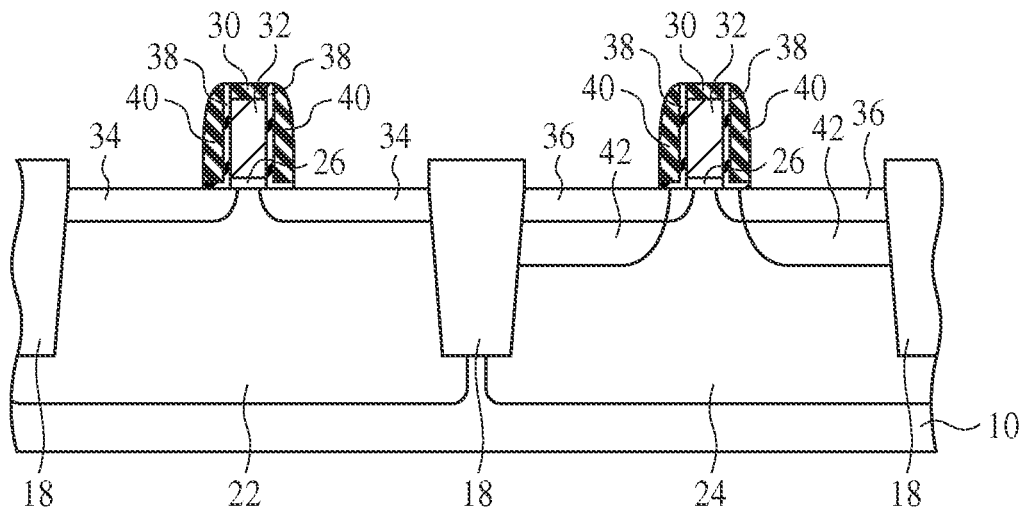

Then, a photoresist film (not illustrated) covering the n-channel transistor forming region and exposing the p-channel transistor forming region is formed. Then, with the photoresist film and the gate electrode 32 and the sidewall insulating films 38, 40 as the mask, a p-type impurity ions are implanted to form impurity diffused region 42 in the silicon substrate 10 on both sides of the gate electrode 32 (FIG. 10A). In the following explanation, for the convenience of the explanation, the impurity diffused regions 36, 42 as a whole are called impurity diffused regions 42.

Next, by photolithography, a photoresist film 44 covering the p-channel transistor forming region and exposing the n-channel transistor forming region is formed.

Figure 10B:
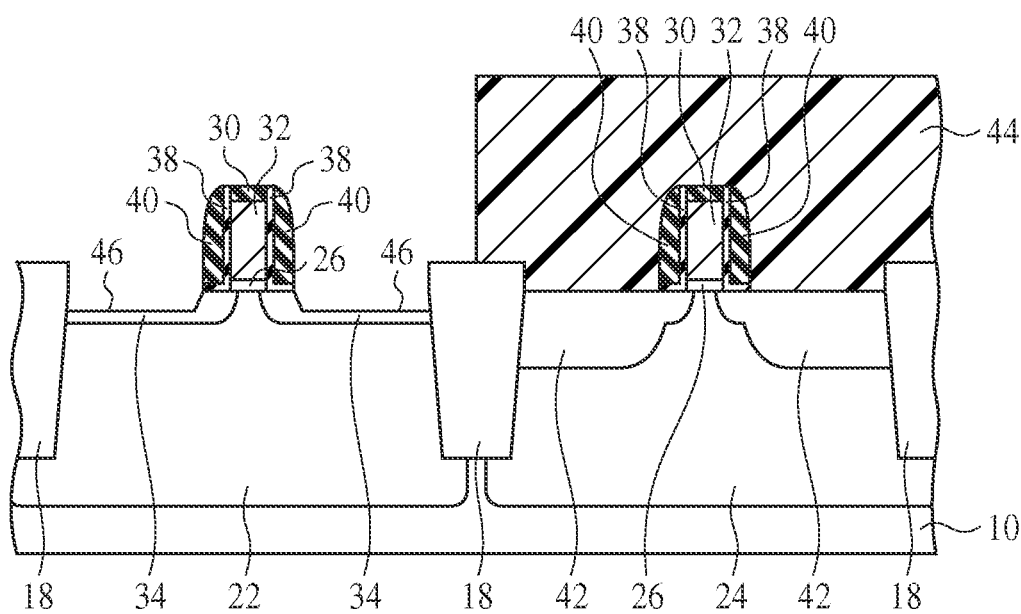

Then, with the photoresist film 44, the gate electrode 32 and the sidewall insulating films 38, 40 as the mask, the silicon substrate 10 is dry etched to form trenches 46 of an about 20 nm-depth in the surface of the silicon substrate 10 in the impurity diffused regions 34 (FIG. 10B).

Next, the photoresist film 44 is removed by, e.g., ashing.

Figure 11A:
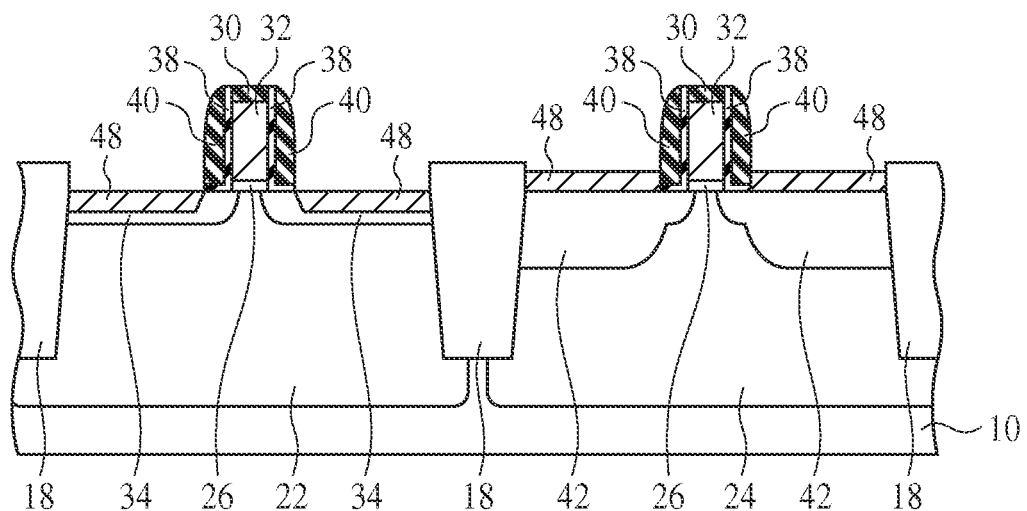

Then, in the trenches 46 in the n-channel transistor forming region and on the silicon substrate 10 in the p-channel transistor forming region, an undoped $Si_{1-y}C_y$ film 48 of, e.g., a 15 nm-thickness is formed by, e.g., molecular beam epitaxy method or thermal selective epitaxy method (FIG. 11A). For the growth of the $Si_{1-y}C_y$ film 48, for example, $SiH_3CH_3$, $SH_4$, $H_2$ and HCl, are used as the raw material gas, and growth temperature is set at, e.g., 600° C. The composition ratio of the $Si_{1-y}C_y$ film 48 is an about 1-3% carbon concentration, e.g., $Si_{0.98}C_{0.02}$ (about 2% carbon content).

Then, by photolithography, a photoresist film (not illustrated) covering the p-channel transistor forming region and exposing the n-channel transistor forming region is formed. Then, with the photoresist film, the gate electrode 32 and the sidewall insulating films 38, 40 as the mask, n-type impurity ions are implanted into the $Si_{1-y}C_y$ film 18 in the n-channel transistor forming region. The ion implantation conditions are, for example, phosphorus ions as the ion species, 1 keV acceleration energy and $1\times10^{15}$ cm$^{-2}$ dose.

Next, by photolithography, a photoresist film (not illustrated) covering the n-channel transistor forming region and exposing the p-channel transistor forming region is formed, and then with the photoresist film, the gate electrode 32 and the sidewall insulating films 38, 40 as the mask, p-type impurity ions are implanted into the $Si_{1-y}C_y$ film 48 in the p-channel transistor forming region. The implantation conditions are, for example, boron ions as the ion species, 0.5 keV acceleration energy and $1\times10^{15}$ cm$^{-2}$ dose.

Next, the impurities implanted in the $Si_{1-y}C_y$ film 48 are activated by, e.g., rapid thermal annealing at the maximum temperature of not more than 950° C.

Next, over the entire surface, a silicon nitride film of, e.g., a 20 nm-thickness is deposited by, e.g., CVD method.

Figure 11B:
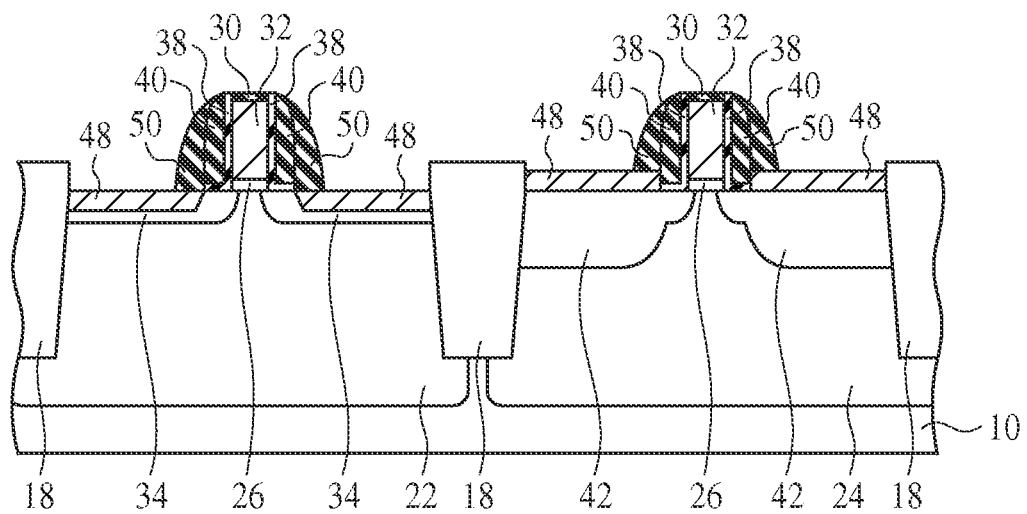

Then, by dry etching, the silicon nitride film is etched back to form a sidewall insulating film 50 of silicon nitride film on the side walls of the gate electrodes 32 with the sidewall insulating films 38, 40 formed on (FIG. 11B).

Next, over the entire surface, a silicon oxide film 52 of, e.g., a 40 nm-thickness is formed by, e.g., CVD method. The substrate temperature is set at, e.g., not more than 530° C.

Next, by photolithography, a photoresist film 54 covering the n-channel transistor forming region and exposing the p-channel transistor forming region is formed.

Next, with the photoresist film 54 as the mask, the silicon oxide film 52 is etched to remove selectively the silicon oxide film 52 in the p-channel transistor forming region.

Figure 12A:
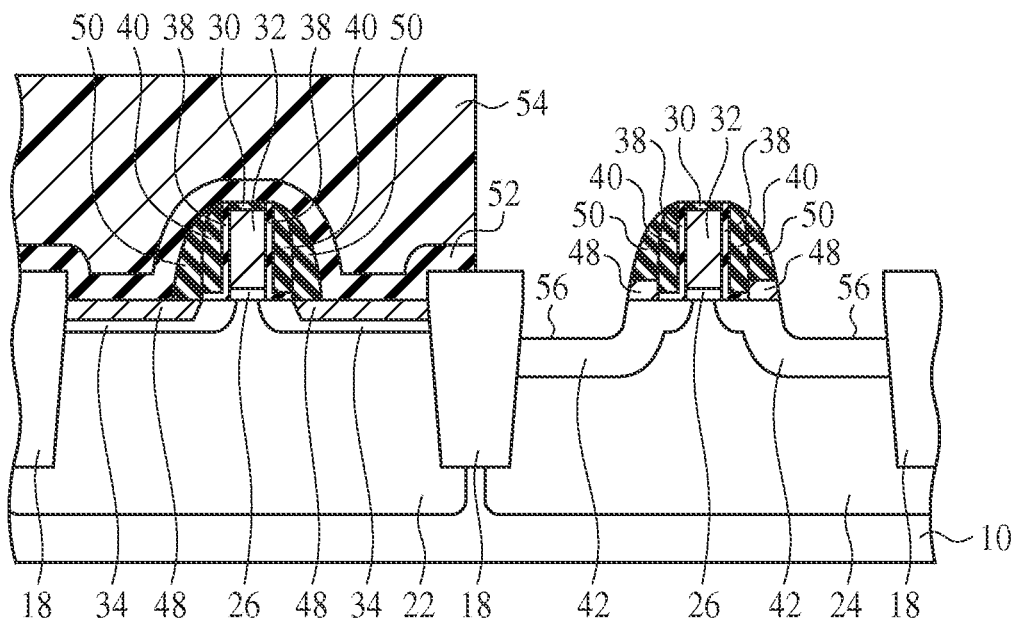

Next, with the photoresist film 54, the gate electrode 32 and the sidewall insulating films 38, 40, 50 as the mask, the $Si_{1-y}C_y$ film 48 and the silicon substrate 10 are dry etched to form a trench 56 of an about 40 nm-depth in the surface of the silicon substrate 10 in the impurity diffused regions 42 (FIG. 12A). At this time, the $Si_{1-y}C_y$ film 48 at the part covered by the sidewall insulating film 50 is not removed and is left below the sidewall insulating film 50.

Next, the photoresist film 54 is removed by, e.g., ashing.

Figure 12B:
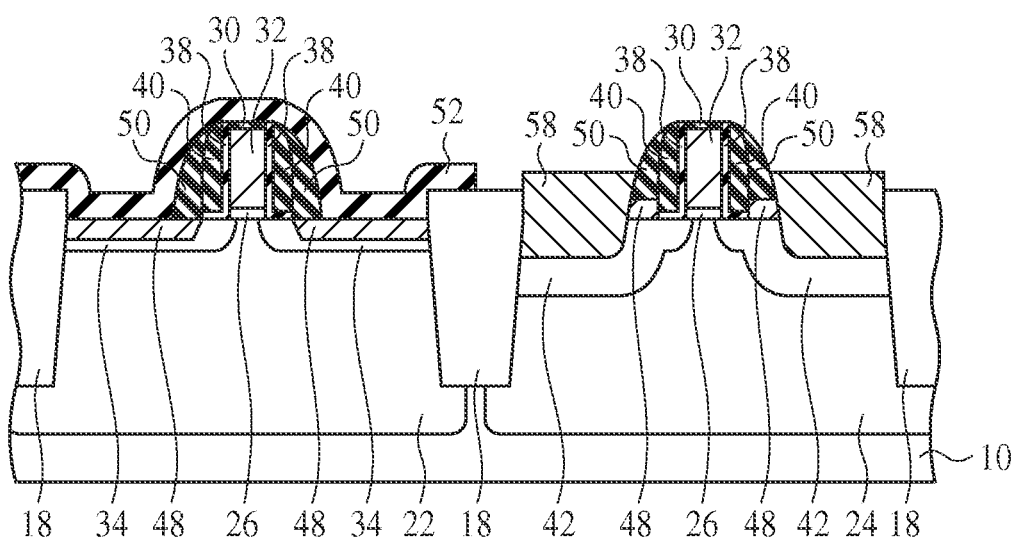

Then, in the trench 56 in the p-channel transistor forming region, a p-type SiGe film 58 of, e.g., a 60 nm-thickness is selectively grown by, e.g., thermal selective epitaxy method or molecular beam epitaxy method (FIG. 12B). For the growth of the SiGe film 58, for example, $SiH_4$, $GeH_4$, $H_2$, HCl and $B_2H_6$ are used as the raw material gas, and the growth temperature is set at, e.g., 600° C. The composition ratio of the SiGe film 58 is an about 15-25% germanium concentration, e.g., $Si_{0.80}Ge_{0.20}$ (about 20% germanium content).

When the SiGe film 58 has a germanium concentration of less than 15%, the lattice constant difference from silicon is too small, and the SiGe film 58 may not function as the stressor. When the SiGe film 58 has a germanium concentration of more than 25%, the lattice constant difference from silicon is too large, and dislocations take place. In view of them, it is preferable that the germanium concentration of the SiGe film 58 is set at 15-25%, more preferably 15-18%.

Next, by photolithography, a photoresist film (not illustrated) covering the p-channel transistor forming region and exposing the n-channel transistor forming region is formed, and then, with the photoresist film, the gate electrode 32 and the sidewall insulating films 38, 40, 50 as the mask, n-type impurity ions are implanted into the $Si_{1-y}C_y$ films 48 in the n-channel transistor forming region. The ion implantation conditions are, for example, phosphorus ions as the ion species, 5 keV acceleration energy and $5\times10^{15}$ cm$^{-2}$ dose.

Then, by photolithography, a photoresist film (not illustrated) covering the n-channel transistor forming region and exposing the p-channel transistor forming region is formed, and then with the photoresist film, the gate electrode 32 and the sidewall insulating films 38, 40, 50 as the mask, p-type impurity ions are implanted into the SiGe films 58 in the p-channel transistor forming region. The ion implantation conditions are, for example, boron as the ion species, 3 keV acceleration energy and $6\times10^{15}$ cm$^{-2}$ dose.

Next, the impurities implanted in the $Si_{1-y}C_y$ films 48 and the SiGe films 58 are activated by, e.g., rapid thermal annealing at 1000° C.

Figure 13A:
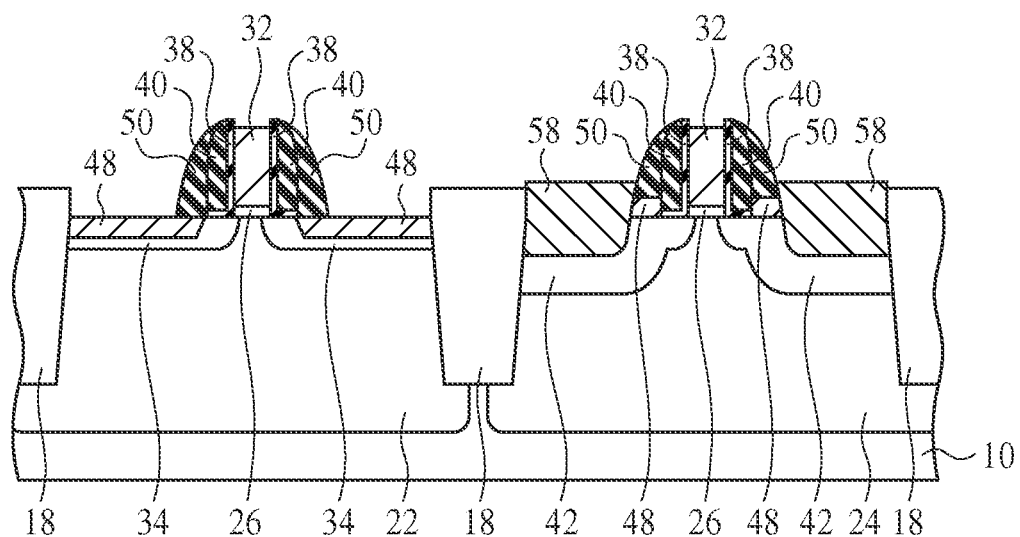

Then, by, e.g., dry etching, the silicon oxide film 52 covering the n-channel transistor forming region, and the silicon nitride film 30 covering the gate electrodes 32 are removed (FIG. 13A).

Next, over the entire surface, e.g., a nickel film of a 10 nm-thickness is deposited by, e.g., sputtering method.

Figure 13B:
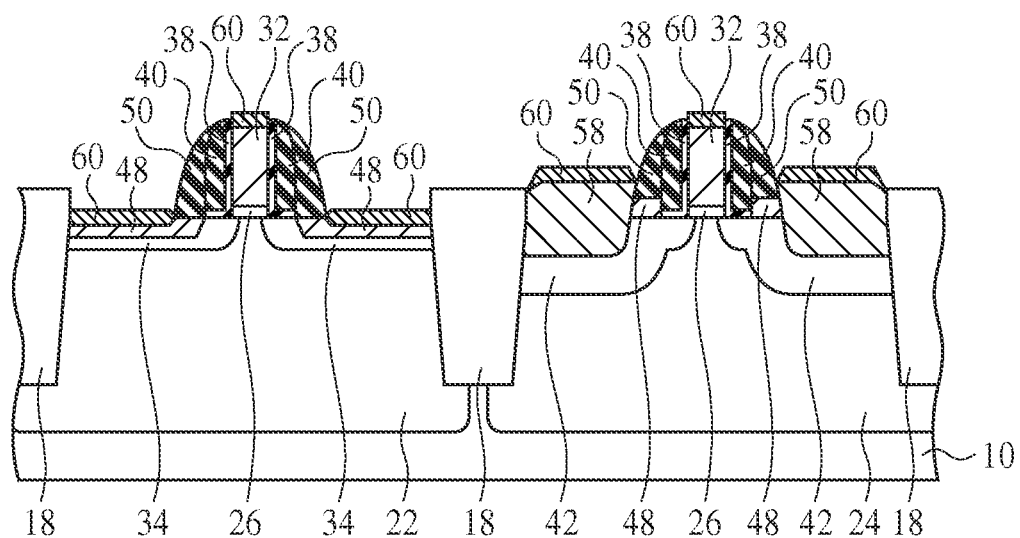

Then, the nickel film and the gate electrodes 32, the nickel film and the $Si_{1-y}C_y$ film 48, and the nickel film and the SiGe film 58 are respectively reacted with each other by, e.g., the rapid thermal annealing at about 300° C. to form a nickel silicide film 60 on the gate electrodes 32, $Si_{1-y}C_y$ film 48 and the SiGe film 58 (FIG. 13B).

Thus, the semiconductor device according to the present embodiment illustrated in FIG. 1 is formed.

Then, in the same way as in the usual manufacturing process of semiconductor devices, inter-layer insulating films and interconnection layers are repeatedly formed, and the semiconductor device is completed.

As described above, according to the present embodiment, SiGe film is buried in the source/drain regions of the p-channel MIS transistor, and $Si_{1-y}C_y$ film is formed on the silicon substrate between the SiGe film and the channel region, whereby a compressive stress can be effectively applied to the end of the channel region. Thus, the injection rate of carriers from the end of the channel region can be improved, and resultantly the operation speed of the p-channel MIS transistor can be improved.

A Second Embodiment

The semiconductor device and the method of manufacturing the same according to a second embodiment will be explained with reference to FIGS. 14 to 18B. The same members of the present embodiment as those of the semiconductor device and the method of manufacturing the same according to the first embodiment illustrated in FIGS. 1 to 13B are represented by the same reference numbers not to repeat or to simplify their explanation.

Figure 14:
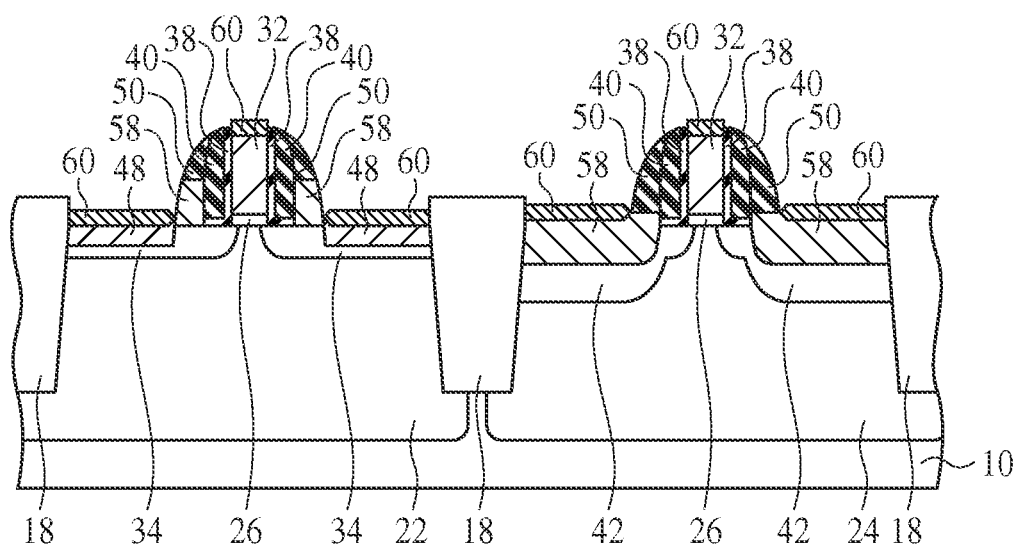
FIG. 14 is a diagrammatic sectional view illustrating the structure of the semiconductor device according to a second embodiment.

FIG. 14 is a diagrammatic sectional view illustrating the structure of the semiconductor device according to the present embodiment. FIGS. 15A to 18B are sectional views illustrating the method of manufacturing the semiconductor device according to the present embodiment.

First, the structure of the semiconductor device according to the present embodiment will be explained with reference to FIG. 14.

In a silicon substrate 10, a device isolation film 18 for defining device regions is formed. In FIG. 14, the device region on the left side of the middle device isolation film 18 is an n-channel transistor forming region, and the device region on the right side of the middle device isolation film 18 is a p-channel transistor forming region.

In the silicon substrate 10 in the n-channel transistor forming region, a p-well 22 is formed. In the silicon substrate 10 in the p-channel transistor forming region, an n-well 24 is formed.

Over the silicon substrate 10 in the n-channel transistor forming region, a gate electrode 32 is formed with a gate insulating film 26 formed therebetween. The surface of the silicon substrate 10 immediately below the gate electrode 32 is to be the channel region of the n-channel transistor. In the silicon substrate 10 on both sides of the gate electrode 32, impurity diffused regions 34 are formed. On the side wall of the gate electrode 32, sidewall insulating films 38, 40, 50 are formed. On the surface of the silicon substrate 10 in regions where the sidewall insulating films 38, 40 are not formed, $Si_{1-y}C_y$ films 48 are buried. The y-value stands for C fraction. Between the sidewall insulating film 50 and the silicon substrate 10, SiGe films 58 are formed. On the gate electrode 32 and the $Si_{1-y}C_y$ films 48 in regions where the sidewall insulating film 50 is not formed, nickel silicide films 60 are respectively formed. Thus, in the n-channel transistor forming region, an n-transistor including the $Si_{1-y}C_y$ film 48 buried in the source/drain regions, and the SiGe film 58 formed on the silicon substrate 10 between the channel region and the $Si_{1-y}C_y$ film 48 is formed.

Over the silicon substrate 10 in the p-channel transistor forming region, a gate electrode 32 is formed with a gate insulating film 26 formed therebetween. The surface of the silicon substrate 10 immediately below the gate electrode 32 is to be the channel region of the p-channel transistor. In the silicon substrate 10 on both sides of the gate electrode 32, impurity diffused regions 42 are formed. On the side wall of the gate electrode 32, sidewall insulating films 38, 40, 50 are formed. On the surface of the silicon substrate 10 in regions where the sidewall insulating films 38, 40 are not formed, SiGe films 58 are buried. On the gate electrode 32 and the SiGe films 58, nickel silicide films 60 are respectively formed. Thus, in the p-channel transistor forming region, a p-channel transistor including the SiGe films 58 buried in the source/drain regions is formed.

As described above, the semiconductor device according to the present embodiment includes in the n-channel transistor the $Si_{1-y}C_y$ films 48 buried in the source/drain regions and the SiGe film 58 formed on the silicon substrate 10 between the channel region and the $Si_{1-y}C_y$ films 48.

Opposite to the p-channel transistor of the first embodiment, a tensile strain is introduced in the channel region of the n-channel transistor, whereby the mobility of electrons flowing in the channel can be improved.

Then, in the n-channel transistor, opposite to the p-channel transistor of the first embodiment, a material whose lattice constant is smaller than silicon and which can apply the tensile stress in the direction parallel to the surface of the silicon substrate 10, e.g., the $Si_{1-y}C_y$ film 48 is buried, and a material whose lattice constant is larger than silicon and which can apply the tensile stress in the direction parallel to the surface of the silicon substrate 10, e.g., the SiGe film 58 is formed on the silicon substrate 10 between the channel region and the $Si_{1-y}C_y$ films 48.

The n-channel transistor is thus constituted, whereby the mobility of electrons flowing in the channel can be improved in comparison with that of the transistor having $Si_{1-y}C_y$ film alone formed in the source/drain regions. The mechanism of the improvement of the electron mobility is the same as that of the p-channel transistor of the first embodiment except that the application direction of the stress is opposite.

Then, the method of manufacturing the semiconductor device according to the present embodiment will be explained with reference to FIGS. 15A to 18B.

Figure 15A:
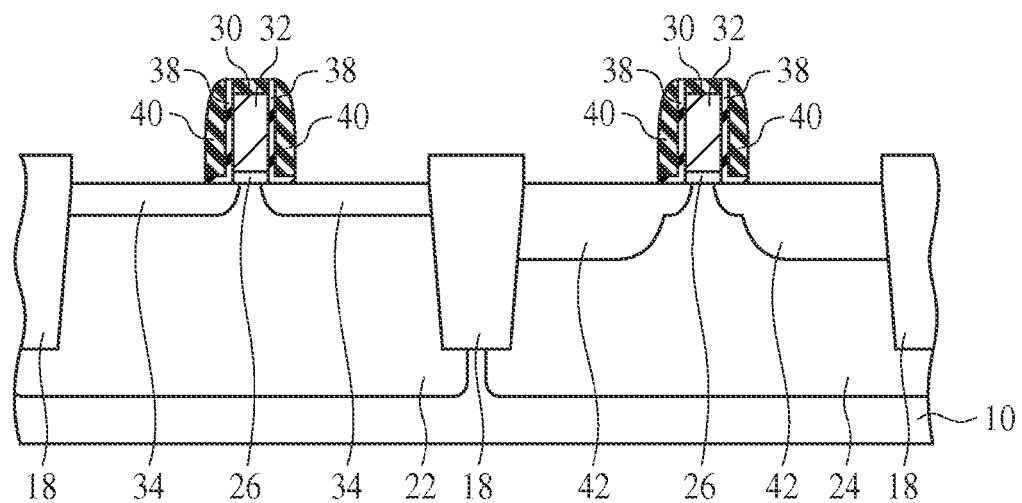
FIGS. 15A-15B, 16A-16B, 17A-17B and 18A-18B are sectional views illustrating a method of manufacturing the semiconductor device according to the second embodiment.

First, in the same way as in, e.g., the method of manufacturing the semiconductor device according to the first embodiment illustrated in FIGS. 7A to 10A, the device isolation film 18, the n-well 22, the p-well 24, the gate electrodes 32, the sidewall insulating films 38, 40, the impurity diffused regions 34, 42, etc. are formed on the semiconductor substrate 10 (FIG. 15A).

Next, a photoresist film 54 covering the n-channel transistor forming region and exposing the p-channel transistor forming region is formed by photolithography.

Figure 15B:
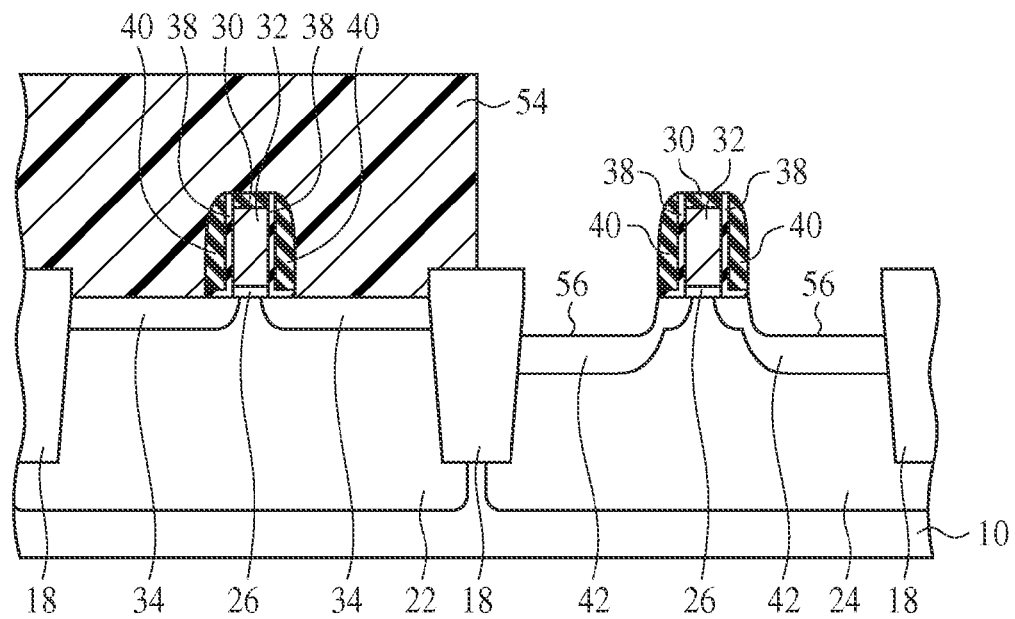

Next, with the photoresist film 54, the gate electrodes 32 and the sidewall insulating films 38, 40 as the mask, the silicon substrate 10 is dry etched to form the trench 56 of an about 40 nm-depth in the surface of the silicon substrate 10 in the impurity diffused regions 42 (FIG. 15B).

Next, the photoresist film 54 is removed by, e.g., ashing.

Figure 16A:
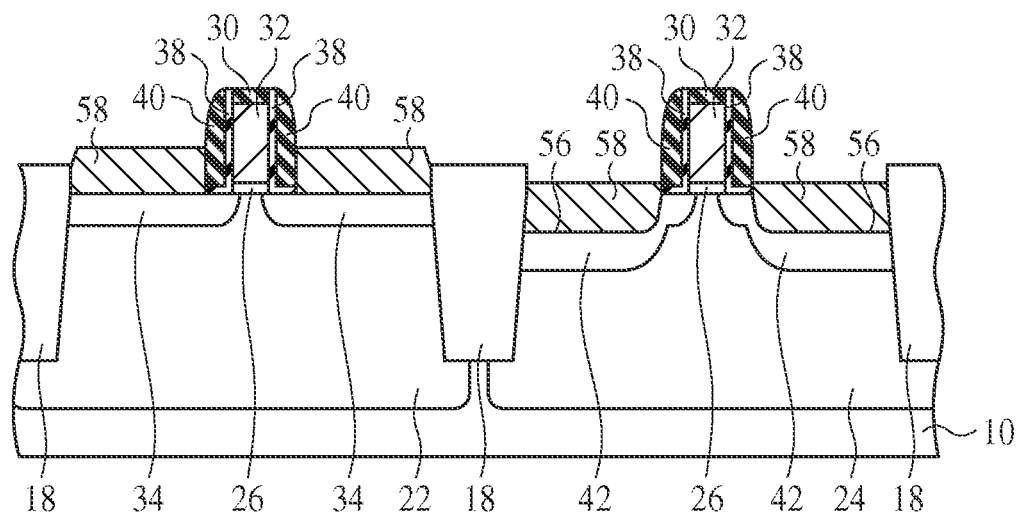

Then, in the trench 56 in the p-channel transistor forming region and on the silicon substrate 10 in the n-channel transistor forming region, the p-type SiGe films 58 of, e.g., a 40 nm-thickness are formed selectively by, e.g., molecular beam epitaxy method or thermal selective epitaxy method (FIG. 16A). For the growth of the SiGe films 58, for example, SiH$_4$, GeH$_4$, H$_2$, and HCl are used as the raw material gas, and the growth temperature is set at, e.g., 600° C. The composition ratio of the SiGe films 58 is an about 15-25% germanium concentration, e.g., Si$_{0.80}$Ge$_{0.20}$ (containing germanium by about 20%).

When the SiGe film has a germanium concentration of less than 15%, the lattice constant difference from silicon is too small, and the SiGe film cannot act as the stressor. On the other hand, when the SiGe film 58 has a germanium concentration of more than 25%, the lattice constant difference from silicon is too large, and dislocations take place. In view of them, it is preferable that the germanium concentration of the SiGe film 58 is set at 15-25%, more preferably 15-18%.

Next, a photoresist film covering the n-channel transistor forming region and exposing the p-channel transistor forming region is formed by photolithography. Then, B ion is implanted into the region of p-channel transistor forming region by acceleration energy 3 keV, dosage 6×10$^{15}$ atoms/cm$^2$. The photoresist film is removed by ashing.

Next, a photoresist film covering the p-channel transistor forming region and exposing the n-channel transistor forming region is formed by photolithography. As ions is implanted into the region of the n-channel transistor forming region by acceleration energy 2 keV, dosage 6×10$^{15}$ atoms/cm$^2$. The photoresist film is removed by ashing. Activation annealing is performed by, e.g., 950° C., 0 sec (spike-annealing).

Next, over the entire surface, a silicon nitride film of, e.g., a 20 nm-thickness is deposited by, e.g., CVD method.

Figure 16B:
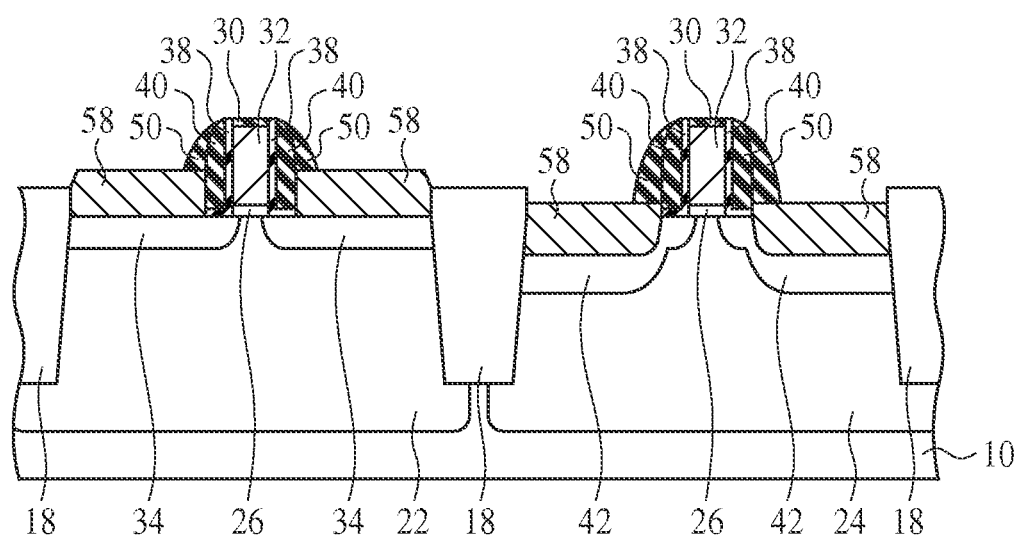

Next, by dry etching, the silicon nitride film is etched back to form the sidewall insulating film 50 of silicon nitride film on the side walls of the gate electrodes 32 with the sidewall insulating films 38, 40 formed on (FIG. 16B).

Then, over the entire surface, a silicon oxide film 52 of, e.g., a 40n nm-thickness is formed by, e.g., CVD method. The substrate temperature is set at, e.g., not more than 530° C.

Then, by photolithography, a photoresist film 44 covering the p-channel transistor forming region and exposing the n-channel transistor forming region is formed.

Figure 17A:
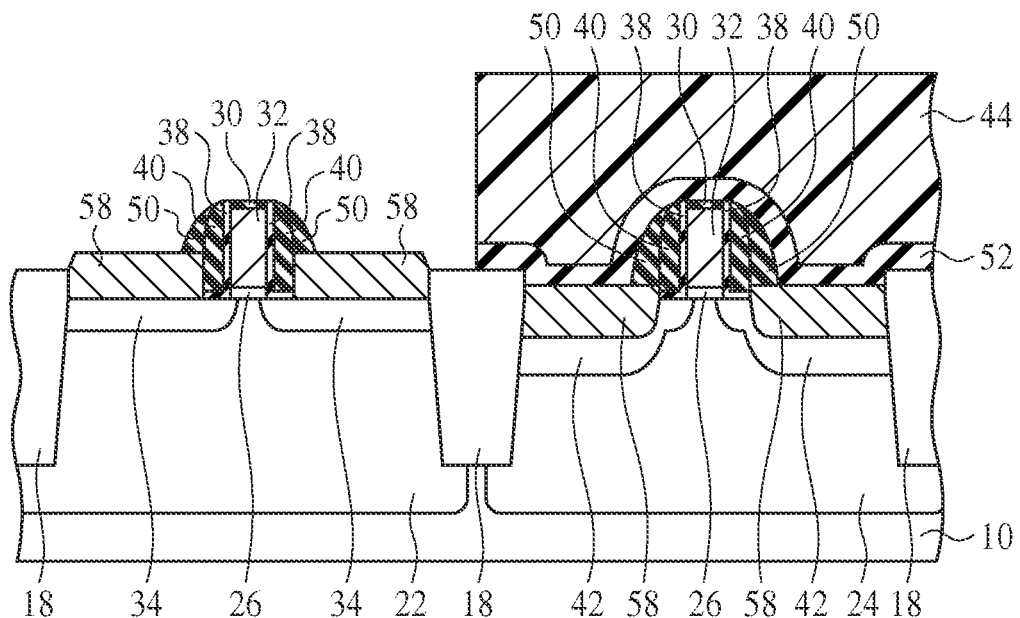

Next, with the photoresist film 44 as the mask, the silicon oxide film 52 is etched to selectively remove the silicon oxide film 52 in the n-channel transistor forming region (FIG. 17A).

Figure 17B:
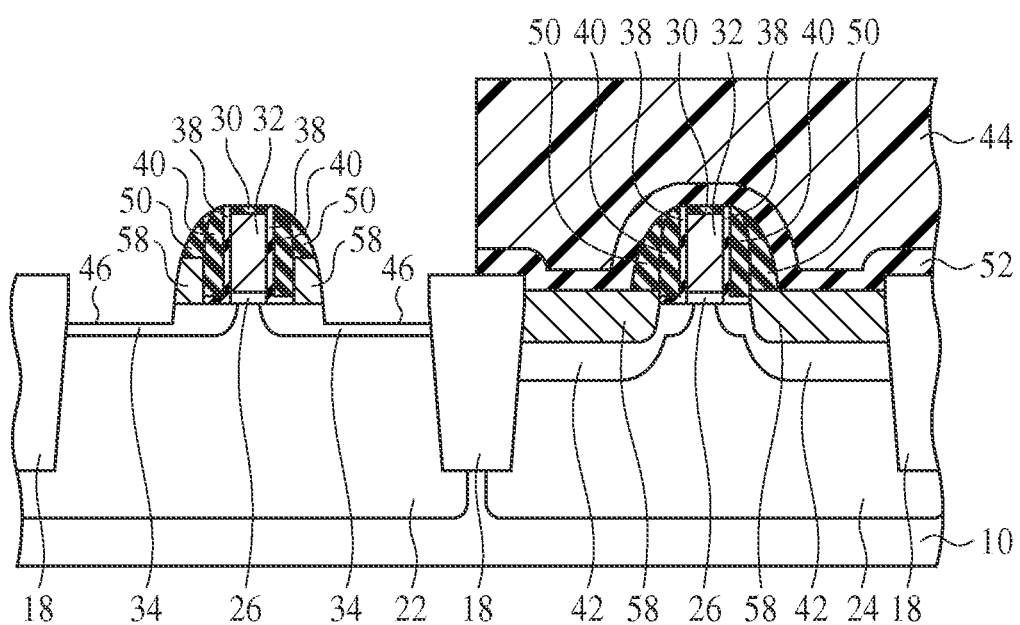

Then, with the photoresist film 44, the gate electrode 32 and the sidewall insulating films 38, 40, 50 as the mask, the SiGe film 58 and the silicon substrate 10 are dry etched to from the trenches 46 of an about 20 nm-depth in the surface of the silicon substrate 10 in the impurity diffused regions 34 (FIG. 17B).

Next, the photoresist film 44 is removed by, e.g., ashing.

Figure 18A:
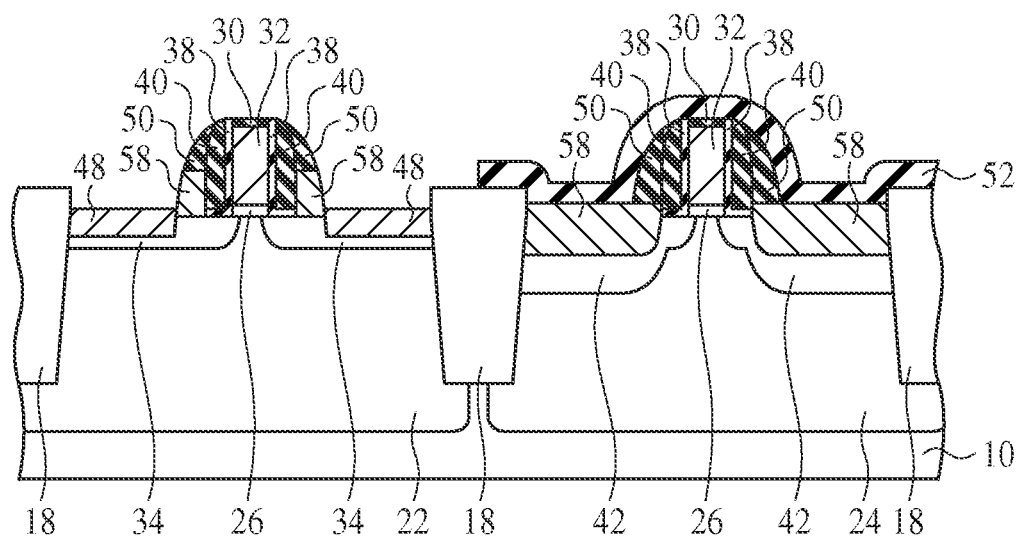

Then, in the trenches 46 in the n-channel transistor forming region, undoped Si$_{1-y}$C$_y$ films 48 of, e.g., a 15 nm-thickness are selectively grown by, e.g., molecular beam epitaxy method (FIG. 18A). For the growth of the Si$_{1-y}$C$_y$ films 48, for example, as the raw material gas, SiH$_3$CH$_3$, SiH$_4$, H$_2$ and HCl are used, and the growth temperature is set at, e.g., 600° C. The composition ratio of the Si$_{1-y}$C$_y$ film 48 is an about 1-3% carbon concentration, e.g., Si$_{0.98}$C$_{0.02}$ (containing carbon by about 2%).

Then, the silicon oxide film 52 covering the p-channel transistor forming region is removed by, e.g., dry etching.

Next, by photolithography, a photoresist film (not illustrated) covering the p-channel transistor forming region and exposing the n-channel transistor forming region is formed, and then, with the photoresist film, the gate electrode 32 and the sidewall insulating films 38, 40, 50 as the mask, n-type impurity ions are implanted into the Si$_{1-y}$C$_y$ films 48 in the n-channel transistor forming region. The ion implantation conditions are, for example, phosphorus ions as the ion species, 5 keV acceleration energy and 5×10$^{15}$ cm$^{-2}$ dose.

Then, by photolithography, a photoresist film (not illustrated) covering the n-channel transistor forming region and exposing the p-channel transistor forming region is formed, and then with the photoresist film, the gate electrode 32 and the sidewall insulating films 38, 40, 50 as the mask, p-type impurity ions are implanted into the SiGe films 58 in the p-channel transistor forming region. The ion implantation conditions are, for example, boron as the ion species, 3 keV acceleration energy and 6×10$^{15}$ cm$^{-2}$ dose.

Figure 18B:
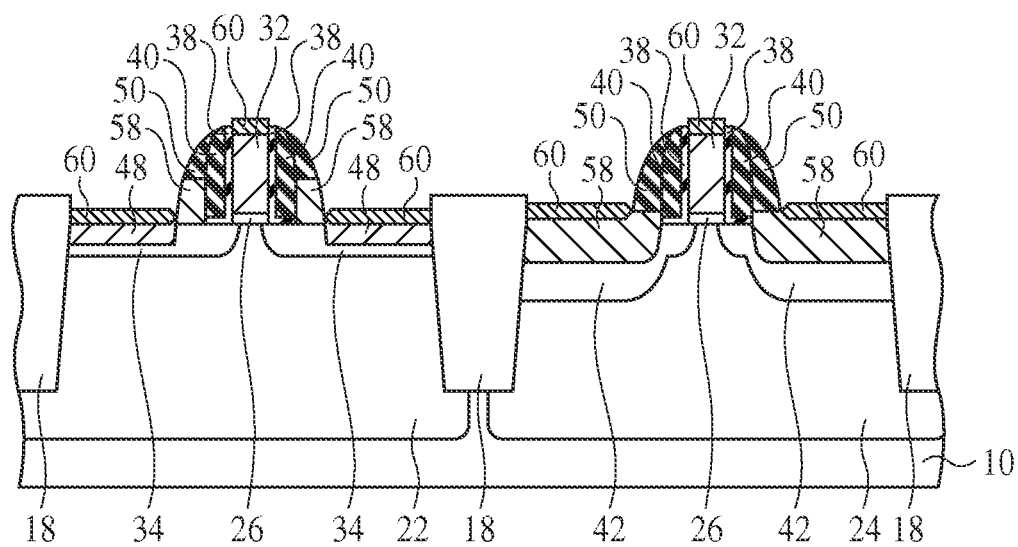

Then, in the same way as, e.g., in the method of manufacturing the semiconductor device according to the first embodiment illustrated in FIG. 13B, a nickel silicide films 60 are formed on the gate electrodes 32, the Si$_{1-y}$C$_y$ films 48 and the SiGe films 58 (FIG. 18B).

Thus, the semiconductor device according to the present embodiment illustrated in FIG. 14 is formed.

Then, in the usual manufacturing process for the semiconductor devices, inter-layer insulating films and interconnection layers are repeatedly formed, and the semiconductor device is completed.

As described above, according to the present embodiment, the Si$_{1-y}$C$_y$ film is buried in the source/drain regions of the n-channel MIS transistor, and the SiGe film is formed on the silicon substrate between the Si$_{1-y}$C$_y$ film and the channel region, whereby the tensile stress can be effectively applied to the end of the channel region. Thus, the injection rate of carriers from the end of the channel region can be improved, and resultantly the operation speed of the n-channel MIS transistor can be improved.

A Third Embodiment

The semiconductor device and the method of manufacturing the same according to a third embodiment will be explained with reference to FIGS. 19 to 20C. The same members of the present embodiment as those of the semiconductor device and the method of manufacturing the same according to the first and the second embodiments illustrated in FIGS. 1 to 18B are represented by the same reference numbers not to repeat or to simplify their explanation.

Figure 19:
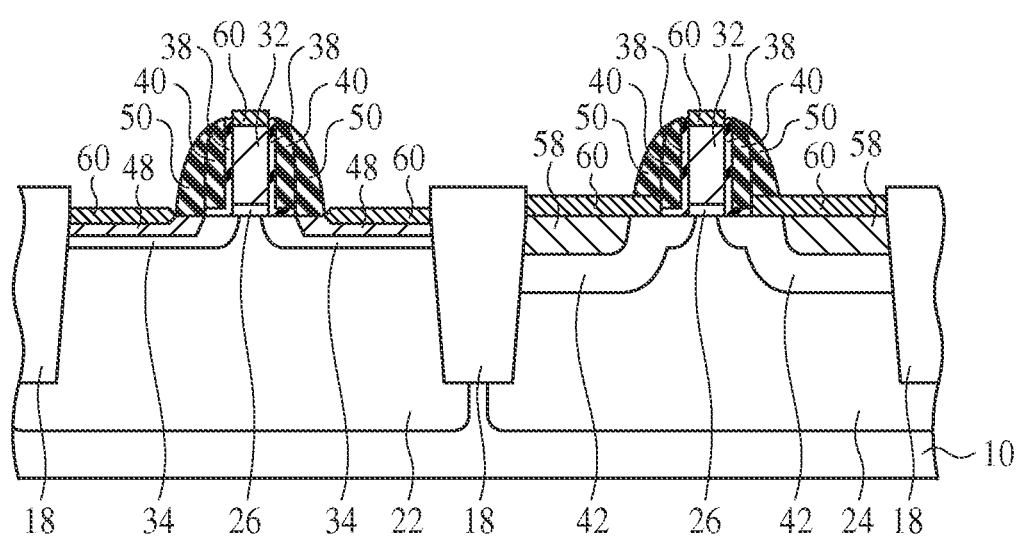
FIG. 19 is a diagrammatic sectional view illustrating the structure of the semiconductor device according to a third embodiment.
Figure 20A:
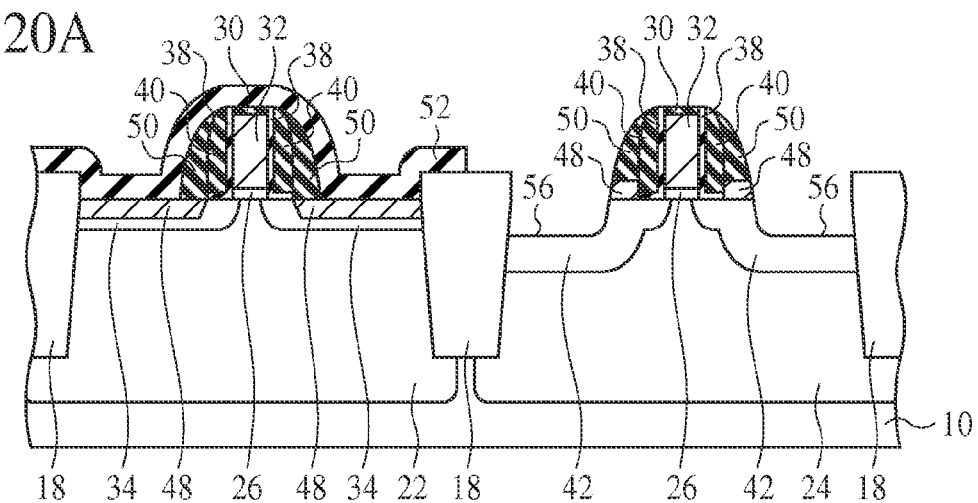
FIGS. 20A-20C are sectional views illustrating a method of manufacturing the semiconductor device according to the third embodiment.
Figure 20B:
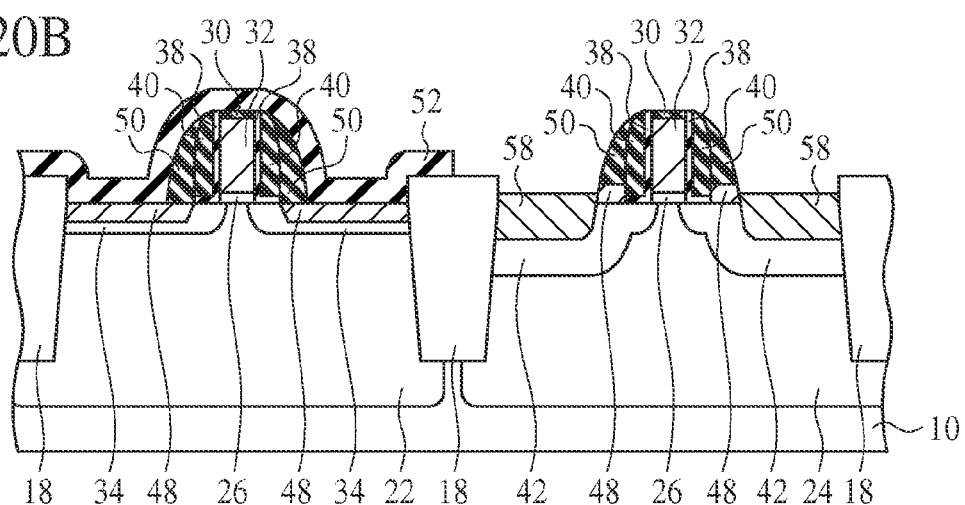
Figure 20C:
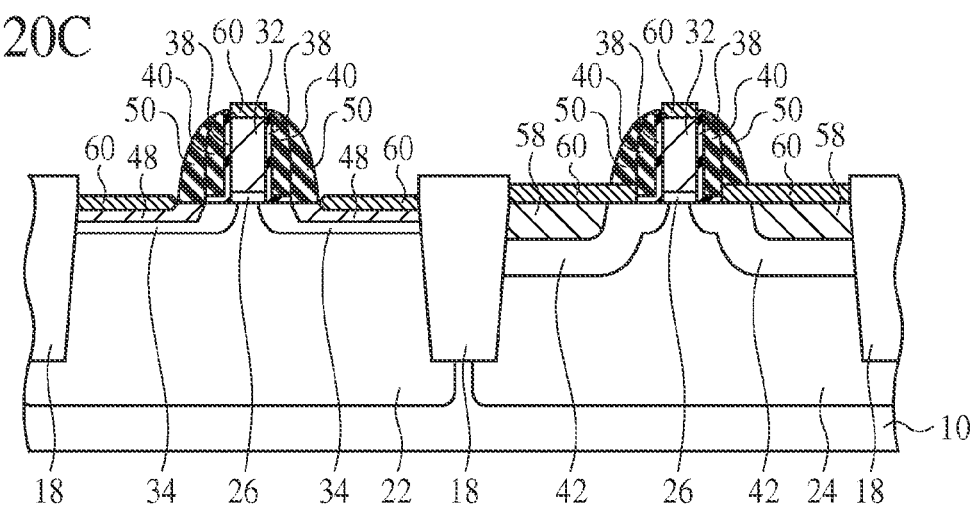

FIG. 19 is a diagrammatic sectional view illustrating the structure of the semiconductor device according to the present embodiment. FIGS. 20A-20C are sectional views illustrating the method of manufacturing the semiconductor device according to the present embodiment.

First, the structure of the semiconductor device according to the present embodiment will be explained with reference to FIG. 19.

The semiconductor device according to the present embodiment is the same as the semiconductor device according to the first embodiment illustrated in FIG. 1 except the structure of the p-channel transistor.

Over a silicon substrate 10 in the p-channel transistor forming region, a gate electrode 32 is formed with a gate insulating film 26 formed therebetween. The surface of the silicon substrate 10 immediately below the gate electrode 32 is to be the channel region of the p-channel transistor. In the silicon substrate 10 on both sides of the gate electrode 32, impurity diffused regions 42 are formed. Sidewall insulating films 38, 40, 50 are formed on the side wall of the gate electrode 32. SiGe films 58 are buried in the surface of silicon substrate 10 in regions where the sidewall insulating films 38, 40, 50 are not formed. Nickel silicide films 60 are formed on the gate electrode 26 and on the SiGe films 58. The nickel silicide films 60 on the SiGe films 58 are formed, extended on the silicon substrate 10 below the sidewall insulating films 50. Thus, in the p-channel transistor forming region, a p-channel transistor including the SiGe films 58 buried in the source/drain regions, and the nickel silicide films 60 formed on the SiGe films 58 and extended on the silicon substrate 10 between the channel region and the SiGe films 58 is formed.

As described above, the semiconductor device according to the present invention includes the nickel silicide films 60 formed on the SiGe films 58 and extended even on the silicon substrate between the channel region and the SiGe films 58.

When nickel silicide, whose thermal expansion coefficient is larger than that of silicon, is formed at about 400-500° C., and the temperature is lowered to room temperature, the nickel silicide becomes a stressor which applies the compressive stress to silicon. That is, the nickel silicide films 60 formed, extended on the silicon substrate 10 between the channel region and the SiGe films 58 exhibits the same effect as the $Si_{1-y}C_y$ film 48 of the p-channel transistor of the semiconductor device according to the first embodiment and can improve the carrier mobility of the p-channel transistor.

Next, the method of manufacturing the semiconductor device according to the present embodiment will be explained with reference to FIG. 20A to 20C.

First, in the same way as in, e.g., the method of manufacturing the semiconductor device according to the first embodiment illustrated in FIGS. 7A to 12A, over the silicon substrate 10, a device isolation film 18, an n-well 22, a p-well 24, the gate electrodes 32, the sidewall insulating films 38, 40, 50, the impurity diffused regions 34, 42, the $Si_{1-y}C_y$ films 48, the silicon oxide film 52, trenches 56, etc. are formed (FIG. 20A).

Next, in the same way as in, e.g., the method of manufacturing the semiconductor device according to the first embodiment illustrated in FIG. 12B, in the trenches 56 in the p-channel transistor forming region, the p-type SiGe films 58 of, e.g., a 40 nm-thickness are selectively formed. At this time, the growing film thickness of the SiGe films 58 is suitably set so that the side surfaces of the $Si_{1-y}C_y$ films 48 on the sides of the trenches 56 are not completely covered with the SiGe films 58 (FIG. 20B).

Next, by photolithography, a photoresist film (not illustrated) covering the p-channel transistor forming region and exposing the n-channel transistor forming region is formed, and then, with the photoresist film, the gate electrode 32 and the sidewall insulating films 38, 40, 50 as the mask, n-type impurity ions are implanted into the $Si_{1-y}C_y$ films 48 in the n-channel transistor forming region. The ion implantation conditions are, for example, phosphorus ions as the ion species, 5 keV acceleration energy and $5\times10^{15}$ cm$^{-2}$ dose.

Then, by photolithography, a photoresist film (not illustrated) covering the n-channel transistor forming region and exposing the p-channel transistor forming region is formed, and then with the photoresist film, the gate electrode 32 and the sidewall insulating films 38, 40, 50 as the mask, p-type impurity ions are implanted into the SiGe films 58 in the p-channel transistor forming region. The ion implantation conditions are, for example, boron as the ion species, 3 keV acceleration energy and $6\times10^{15}$ cm$^{-2}$ dose.

Next, the impurities implanted in the $Si_{1-y}C_y$ films 48 and the SiGe films 58 are activated by, e.g., rapid thermal annealing at 1000° C.

Then, by, e.g., dry etching, the silicon oxide film 52 covering the n-channel transistor forming region and the silicon nitride film 30 covering the gate electrodes 32 are removed.

Next, in the same way as in, e.g., the method of manufacturing the semiconductor device according to the first embodiment illustrated in FIG. 13B, the nickel silicide films 60 are formed on the gate electrodes 32, the $Si_{1-y}C_y$ films 48 and the SiGe films 58. At this time, in the p-channel transistor forming region, because the side surfaces of the $Si_{1-y}C_y$ films 48 on the side of the trenches 56 are exposed, the silicidation reaction takes place both with the SiGe films 58 and with the $Si_{1-y}C_y$ films 48. Resultantly, the $Si_{1-y}C_y$ films 48 below the sidewall insulating films 50 are replaced by the nickel silicide film 60, whereby the nickel silicide film 60 can be formed, extended on the silicon substrate 10 between the channel region and the SiGe films 58 (FIG. 20C).

Thus, the semiconductor device according to the present embodiment illustrated in FIG. 19 is formed.

Then, in the same way as in the usual manufacturing process for semiconductor devices, inter-layer insulating films, interconnection layers are repeatedly formed, and the semiconductor device is completed.

As described above, SiGe films are buried in the source/drain regions of the p-channel MIS transistor, and metal silicide films for inducing compressive stress in silicon lattices are formed on the silicon substrate between the SiGe films and the channel region, whereby the compressive stress can be effectively applied to the end of the channel region. Thus, the injection rate of carriers from the end of the channel region can be improved, and resultantly the operation speed of the p-channel MIS transistor can be improved.

A Fourth Embodiment

The semiconductor device and the method of manufacturing the same according to a fourth embodiment of the present invention will be explained with reference to FIG. 21. The same members of the present embodiment as those of the semiconductor device and the method of manufacturing the same according to the first to the third embodiments illustrated in FIGS. 1 to 20C are represented by the same reference numbers not to repeat or to simplify their explanation.

Figure 21:
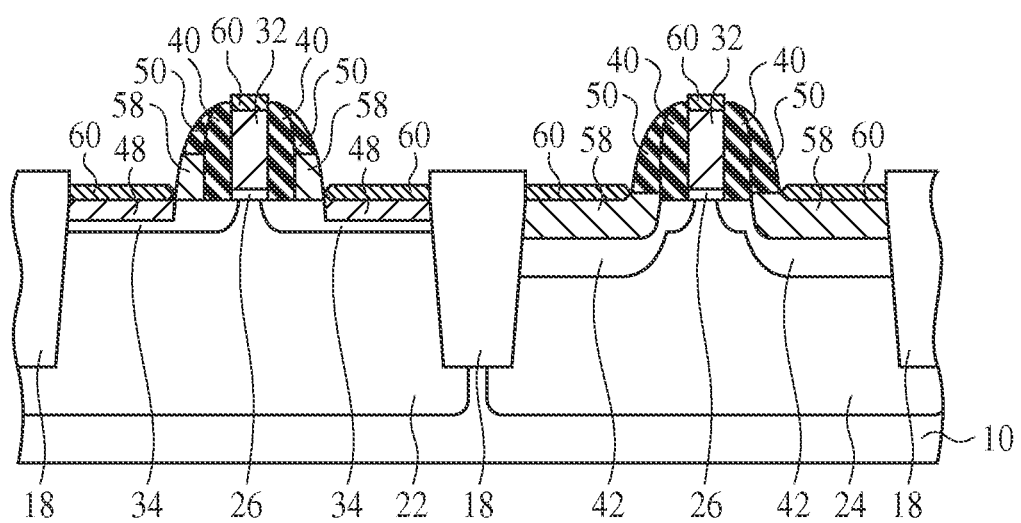
FIG. 21 is a diagrammatic sectional view illustrating the structure of the semiconductor device according to a fourth embodiment.
Figure 22:
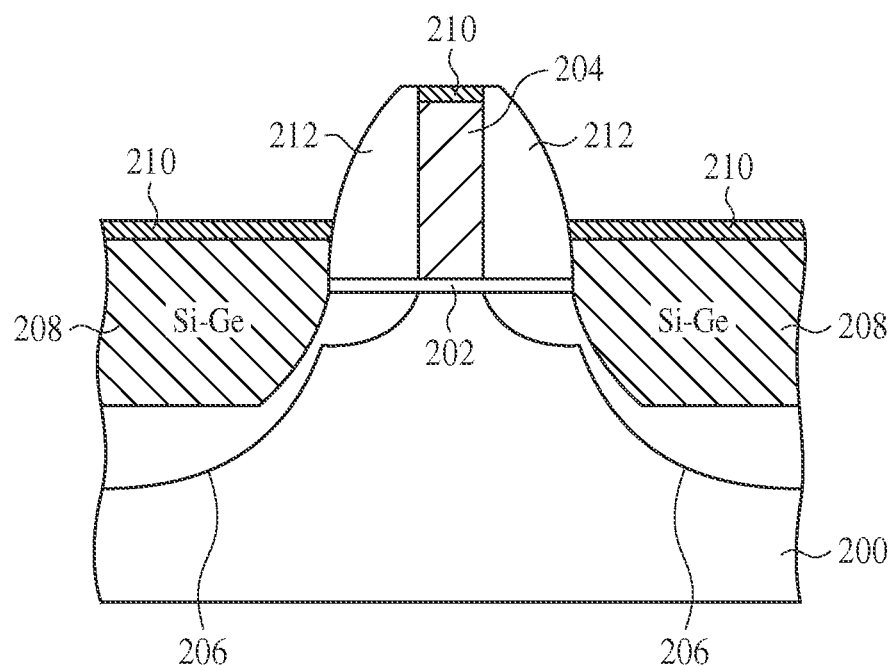
FIG. 22 is a diagrammatic sectional view illustrating the structure of the conventional semiconductor device.

FIG. 21 is a diagrammatic sectional view illustrating the structure of the semiconductor device according to the present embodiment.

As illustrated in FIG. 21, the semiconductor device according to the present embodiment is the same as the semiconductor device according to the second embodiment illustrated in FIG. 14 except that the sidewall insulating films 38 are not formed on the side walls of the gate electrodes 32.

The semiconductor device is thus constituted, which allows the sidewall insulating films 40 to be in contact with the surface of the silicon substrate 10 between the channel region and the SiGe films 58.

Silicon nitride film can be a stressor for applying the compressive stress or a stressor for applying the tensile stress to silicon, depending on its forming conditions. The silicon nitride film forming the sidewall insulating films 40 are formed under conditions for making the silicon nitride film a stressor for applying the compressive stress to silicon, whereby the sidewall insulating films 40 can have the same effect as the $Si_{1-y}C_y$ films 48 of the p-channel transistor of the semiconductor device according to the first embodiment, and the carrier mobility of the p-channel transistor can be improved.

The method of manufacturing the semiconductor device according to the present embodiment is the same as the method of manufacturing the semiconductor device according to the second embodiment except that in the former, the sidewall insulating films 38 are not formed.

Silicon nitride film, which is the stressor for applying the compressive stress to silicon can be formed by, e.g., plasma CVD method and by using $SiH_4$ and $N_2$, for example, as the raw material gas, a 300-400 W RF power and a 300 Torr vacuum degree.

As described above, the SiGe films are buried in the source/drain regions of the p-channel MIS transistor, and silicon nitride film for inducing the compressive stress to silicon lattice is formed on the silicon substrate between the SiGe films and the channel region, whereby the compressive stress can be effectively to the end of the channel region. Thus, the injection rate of carriers from the end of the channel region can be improved, and resultantly the operation speed of the p-channel MIS transistor can be improved.

Modified Embodiments

The above-described embodiments can cover other various modifications.

For example, in the above-described embodiments, the semiconductor material buried in the source/drain diffused regions of the p-channel transistor is formed of SiGe, but a semiconductor material other than SiGe may be used. Semiconductor materials to be buried in the source/drain regions of the p-channel transistor have larger lattice constant than silicon forming the substrate and can be grown epitaxially with respect to the substrate, and other than SiGe, SiSn, etc. can be used. The composition ratio of the semiconductor material can be suitably selected in the range that a required stress necessary to realize prescribed mobility can be applied to the substrate and no dislocation takes place in the growth.

In the first and the second embodiments, for the rationalization of the manufacturing process, the $Si_{1-y}C_y$ film to be formed on the silicon substrate between the channel region and the SiGe film of the p-channel transistor, and the $Si_{1-y}C_y$ film to be buried in the source/drain regions of the n-channel transistor are concurrently formed (the first embodiment), and the SiGe film to be formed on the silicon substrate between the channel region and the $Si_{1-y}C_y$ film of the n-channel transistor, and the SiGe film to be buried in the source/drain regions of the p-channel transistor are concurrently formed (the second embodiment). However, the n-channel transistor and the p-channel transistor may be independently manufactured.

For example, the p-channel transistor may be formed by the method of manufacturing the semiconductor device according to the first embodiment, and the n-channel transistor may be formed by the method of manufacturing the semiconductor device according to the second embodiment. The n-channel transistor may be formed by the method of manufacturing the semiconductor device according to the second embodiment, and the p-channel transistor may be formed by the method for manufacturing the semiconductor device according to the third or the fourth embodiment. The structure of the n-channel transistor and the structure of the p-channel transistor may be arbitrarily combined.

In the semiconductor device according to the above described first embodiment, the sidewall insulating films 50 may be formed of silicon nitride film which is the stressor for applying the tensile stress to silicon. Thus, as in the p-channel transistor of the fourth embodiment, the n-channel transistor of the first embodiment can include the sidewall insulating film 50 which induces the tensile stress in the silicon lattice, and the operation speed of the n-channel MIS transistor can be improved.

Silicon nitride film, which is the stressor for applying the tensile stress to silicon can be formed by, e.g., plasma CVD method and by using $SiH_4$, $NH_4$ and $N_2$, for example, as the raw material gas, a 300-400 W RF power and a 300 Torr vacuum degree.

In the first to the fourth embodiments described above, nickel silicide films are formed both on the gate electrodes and the source/drain regions, but the nickel silicide films on the gate electrodes are not essential. The nickel silicide films on the source/drain regions in the first, the second and the fourth embodiments are not essential.

In the above-described embodiments, the silicide films formed on the gate electrodes 32 and the source/drain regions are the nickel silicide film 60. However, metal silicide materials other than nickel silicide can be used as long as the metal silicide materials have higher thermal expansion coefficients than silicon. The metal silicide materials other than nickel silicide can be, e.g., cobalt silicide, titanium silicide, tungsten silicide, etc.

In the above-described embodiments, the substrate is a silicon substrate. But, the semiconductor substrates other than silicon substrate may be also used. In such case, the material forming the semiconductor region to be buried in the source/drain regions, the stressor film formed on the semiconductor substrate between the channel region and the buried semiconductor region can be suitably selected, based on the relationship with the lattice constant of the substrate material described above, etc.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
 a silicon substrate;
 a channel region formed in the silicon substrate, a conductivity type of the channel region being n-type;
 a gate electrode formed over the channel region of the semiconductor substrate;
 source/drain regions formed in the silicon substrate on both sides of the gate electrode, a conductivity type of the source/drain regions being p-type;
 buried semiconductor regions buried in the source/drain regions, for applying to the surface of the silicon substrate a first stress in a first direction; and
 stressor films formed on and in contact with the silicon substrate between the channel region and the buried semiconductor regions, for applying to the silicon substrate a second stress in a second direction which is opposite to the first direction,
 wherein the buried semiconductor regions are formed of a first semiconductor material whose lattice constant is larger than lattice constant of silicon,
 the stressor films are formed of a second semiconductor material whose lattice constant is smaller than the lattice constant of silicon, and
 the channel region is compressed by the first stress and the second stress.

2. The semiconductor device according to claim 1, wherein the first semiconductor material is SiGe.

3. The semiconductor device according to claim 1, wherein the second semiconductor material is SiC.

4. The semiconductor device according to claim 1, wherein the stressor films are formed of a metal silicide material whose thermal expansion coefficient is larger than silicon.

5. The semiconductor device according to claim 4, wherein the stressor films are extended over the buried semiconductor regions.

6. The semiconductor device according to claim 1, wherein the stressor films are a silicon nitride film.

7. The semiconductor device according to claim 6, wherein the silicon nitride film is a sidewall insulating film formed on a side wall of the gate electrode.

8. The semiconductor device according to claim 2, wherein a composition ratio of germanium in the SiGe is 15%-25%.

9. The semiconductor device according to claim 3, wherein a composition ratio of carbon in the SiC is 1%-3%.

10. A semiconductor device comprising:
a silicon substrate;
a channel region formed in the silicon substrate, a conductive type of the channel region being p-type;
a gate electrode formed over the channel region;
source/drain regions formed in the silicon substrate on both sides of the gate electrode, a conductive type of the source/drain regions being n-type;
buried semiconductor regions buried in the source/drain regions applying to the silicon substrate a first stress in a first direction; and
stressor films formed on and in contact with the silicon substrate between the p type channel region and the buried semiconductor regions applying to the silicon substrate a second stress in a second direction which is opposite to the first direction,
wherein the buried semiconductor regions are formed of a first semiconductor material whose lattice constant is smaller than lattice constant of silicon, and
the stressor films are formed of a second semiconductor material whose lattice constant is larger than the lattice constant of silicon,
the channel region is tensioned by the first stress and the second stress.

11. The semiconductor device according to claim 10, wherein
the first semiconductor material is SiC.

12. The semiconductor device according to claim 10, wherein
the second semiconductor material is SiGe.

13. The semiconductor device according to claim 12, wherein
a composition ratio of germanium in the SiGe is 15%-25%.

14. The semiconductor device according to claim 11, wherein
a composition ratio of carbon in the SiC is 1%-3%.

15. A semiconductor device comprising:
a silicon substrate;
a channel region formed in the silicon substrate, a conductive type of the channel region being n-type;
a gate electrode formed over the channel region of the semiconductor substrate;
source/drain regions formed in the silicon substrate on both sides of the gate electrode, a conductivity type of the source/drain regions being p-type;
buried semiconductor regions buried in the source/drain regions;
stressor films formed on and in contact with the silicon substrate between the channel region and the buried semiconductor regions; and
wherein the buried semiconductor regions apply a compressive stress to a portion of the silicon substrate in contact with the buried semiconductor regions,
wherein the stressor films apply a tensile stress to a portion of the silicon substrate in contact with the stressor films,
wherein the channel region is compressed by the compressive stress and the tensile stress.

16. A semiconductor device comprising:
a silicon substrate;
a channel region formed in the silicon substrate, a conductivity type of the channel region being p-type;
a gate electrode formed over the channel region of the semiconductor substrate;
source/drain regions formed in the silicon substrate on both sides of the gate electrode, a conductivity type of the source/drain regions being n-type;
buried semiconductor regions buried in the source/drain regions;
stressor films formed on and in contact with the silicon substrate between the channel region and the buried semiconductor regions; and
wherein the buried semiconductor regions apply a tensile stress to a portion of the silicon substrate in contact with the buried semiconductor regions,
wherein the stressor films apply a compressive stress to a portion of the silicon substrate in contact with the stressor films,
wherein the channel region is tensioned by the compressive stress and the tensile stress.

17. The semiconductor device according to claim 15, further comprising metal silicide layers formed on and in contact with the buried semiconductor regions.

18. The semiconductor device according to claim 16, further comprising metal silicide layers formed on and in contact with the buried semiconductor regions.

* * * * *